(12) United States Patent
Sugisawa et al.

(10) Patent No.: US 9,343,515 B2
(45) Date of Patent: May 17, 2016

(54) DISPLAY DEVICE, MANUFACTURING METHOD THEREOF, AND ELECTRONIC DEVICE

(71) Applicants: Nozomu Sugisawa, Atsugi (JP); Hisao Ikeda, Zama (JP); Katsuhiro Kikuchi, Osaka (JP); Manabu Niboshi, Osaka (JP); Satoshi Inoue, Osaka (JP); Yuto Tsukamoto, Osaka (JP); Shinichi Kawato, Osaka (JP)

(72) Inventors: Nozomu Sugisawa, Atsugi (JP); Hisao Ikeda, Zama (JP); Katsuhiro Kikuchi, Osaka (JP); Manabu Niboshi, Osaka (JP); Satoshi Inoue, Osaka (JP); Yuto Tsukamoto, Osaka (JP); Shinichi Kawato, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 14/215,692

(22) Filed: Mar. 17, 2014

(65) Prior Publication Data
US 2014/0284576 A1    Sep. 25, 2014

(30) Foreign Application Priority Data
Mar. 21, 2013    (JP) ................................ 2013-058654

(51) Int. Cl.
*H01J 1/62*    (2006.01)
*H01J 63/04*    (2006.01)
*H01L 27/32*    (2006.01)
*H01L 51/52*    (2006.01)

(52) U.S. Cl.
CPC ........ *H01L 27/3246* (2013.01); *H01L 51/5218* (2013.01); *H01L 51/5265* (2013.01); *H01L 51/5281* (2013.01)

(58) Field of Classification Search
CPC ............ H01L 27/3246; H01L 51/5218; H01L 51/5265; H01L 51/5281
USPC ............... 313/498–512, 112, 113; 445/23–25
See application file for complete search history.

(56) References Cited

U.S. PATENT DOCUMENTS

| | | | |
|---|---|---|---|
| 5,144,288 A | 9/1992 | Hamada et al. | |
| 5,780,174 A | 7/1998 | Tokito et al. | |
| 5,869,929 A | 2/1999 | Eida et al. | |
| 5,891,554 A | 4/1999 | Hosokawa et al. | |

(Continued)

FOREIGN PATENT DOCUMENTS

JP    2007-012370 A    1/2007

*Primary Examiner* — Nimeshkumar Patel
*Assistant Examiner* — Kevin Quarterman
(74) *Attorney, Agent, or Firm* — Eric J. Robinson; Robinson Intellectual Property Law Office, P.C.

(57) ABSTRACT

A display device that includes a reflective electrode; a transparent electrode; a partition; an EL layer formed over the partition and the transparent electrode; a semi-transmissive electrode formed over the EL layer; and a coloring layer over the semi-transmissive electrode. A light-emitting region is formed to overlap with the transparent electrode, the EL layer, the semi-transmissive electrode, and the coloring layer. A non-light-emitting region is formed to overlap with the transparent electrode, the partition, the EL layer, and the coloring layer. The non-light-emitting region is formed to surround the light-emitting region. The sum of the optical length of the transparent electrode and the optical length of the EL layer is adjusted to fulfill a condition of a microcavity intensifying light of the color of the coloring layer. The optical length of the partition in the non-light-emitting region is adjusted to weaken external light incident through the coloring layer.

22 Claims, 13 Drawing Sheets

(56) References Cited

U.S. PATENT DOCUMENTS

| | | | |
|---|---|---|---|
| 6,023,073 A | 2/2000 | Strite | |
| 6,049,167 A | 4/2000 | Onitsuka et al. | |
| 6,091,078 A | 7/2000 | Codama | |
| 6,111,355 A | 8/2000 | Inoue | |
| 6,124,024 A | 9/2000 | Hosokawa et al. | |
| 6,140,764 A | 10/2000 | Xu et al. | |
| 6,147,451 A | 11/2000 | Shibata | |
| 6,160,273 A | 12/2000 | Fork | |
| 6,163,110 A | 12/2000 | Arai | |
| 6,366,017 B1 | 4/2002 | Antoniadis | |
| 6,366,025 B1 | 4/2002 | Yamada | |
| 6,505,901 B1 | 1/2003 | Fukuda | |
| 6,639,250 B1 | 10/2003 | Shimoda et al. | |
| 6,680,570 B2 | 1/2004 | Roitman et al. | |
| 6,833,668 B1 | 12/2004 | Yamada | |
| 6,847,163 B1 | 1/2005 | Tsutsui et al. | |
| 6,906,457 B2 | 6/2005 | Song et al. | |
| 7,294,856 B2 | 11/2007 | Ito et al. | |
| 7,317,282 B2 | 1/2008 | Tsutsui et al. | |
| 7,795,809 B2 | 9/2010 | Ito et al. | |
| 8,110,983 B2 | 2/2012 | Tsutsui et al. | |
| 2005/0037234 A1 | 2/2005 | Kim et al. | |
| 2005/0084712 A1 | 4/2005 | Kido et al. | |
| 2005/0098207 A1 | 5/2005 | Matsumoto et al. | |
| 2005/0106419 A1 | 5/2005 | Endoh et al. | |
| 2005/0225232 A1* | 10/2005 | Boroson et al. | 313/504 |
| 2006/0008740 A1 | 1/2006 | Kido et al. | |
| 2007/0001570 A1 | 1/2007 | Nomura et al. | |
| 2007/0296334 A1* | 12/2007 | Matsuda | 313/506 |
| 2009/0051284 A1* | 2/2009 | Cok et al. | 313/506 |
| 2009/0102352 A1* | 4/2009 | Cok et al. | 313/498 |
| 2009/0212694 A1* | 8/2009 | Cok | 313/506 |
| 2011/0095675 A1* | 4/2011 | Oda | 313/499 |
| 2012/0161160 A1 | 6/2012 | Tsutsui et al. | |

* cited by examiner

DISPLAY DEVICE, MANUFACTURING METHOD THEREOF, AND ELECTRONIC DEVICE

BACKGROUND OF THE INVENTION

1. Field of the Invention

The present invention relates to a display device, a manufacturing method thereof, and an electronic device.

2. Description of the Related Art

FIG. 12 illustrates a conventional EL panel with a structure (hereinafter referred to as "WTC structure") including what is called a microcavity (micro optical resonator) and a color filter.

The EL panel illustrated in FIG. 12 includes a first substrate 2102; a reflective electrode 2110 formed as an anode over the first substrate 2102; a first transparent electrode 2112 formed as an anode over the reflective electrode 2110 in a pixel portion (blue) 2172; a second transparent electrode 2114 formed over the reflective electrode 2110 in a pixel portion (green) 2174; a third transparent electrode 2116 formed over the reflective electrode 2110 in a pixel portion (red) 2176; a partition 2118 formed over the first transparent electrode 2112, the second transparent electrode 2114, and the third transparent electrode 2116; an EL layer 2120 formed over the partition 2118, the first transparent electrode 2112, the second transparent electrode 2114, and the third transparent electrode 2116; a semi-transmissive electrode 2122 formed as a cathode over the EL layer 2120; and a second substrate 2152 facing the first substrate 2102 (for example, see Patent Document 1).

On the second substrate 2152, a color filter (blue) (denoted as CF(B) in FIG. 12), a color filter (green) (denoted as CF(G) in FIG. 12), and a color filter (red) (denoted as CF(R) in FIG. 12) are formed, as well as a black matrix BM provided between the CF(B), CF(G), and CF(R).

Note that in FIG. 12, a portion where the black matrix BM is formed is denoted as an area 2201; the central portion (light-emitting region) of the pixel portion (blue) 2172 where the partition 2118 is not formed is denoted as an area 2202; the central portion (light-emitting region) of the pixel portion (green) 2174 where the partition 2118 is not formed is denoted as an area 2204; the central portion (light-emitting region) of the pixel portion (red) 2176 where the partition 2118 is not formed is denoted as an area 2206; an end portion (non-light-emitting region) of the pixel portion (blue) 2172 where the partition 2118 is formed is denoted as an area 2203; an end portion (non-light-emitting region) of the pixel portion (green) 2174 where the partition 2118 is formed is denoted as an area 2205; and an end portion (non-light-emitting region) of the pixel portion (red) 2176 where the partition 2118 is formed is denoted as an area 2207.

In the EL panel illustrated in FIG. 12, the display quality of the panel suffers due to reflection of external light in the areas 2201 to 2207 (for example, contrast or NTSC ratio is reduced).

FIG. 13 shows measurement results of reflectances in the areas 2201 to 2207 when external light enters the EL panel illustrated in FIG. 12. The results show the following relationship: the reflectances in the non-light-emitting areas 2203, 2205, and 2207>the reflectances in the light-emitting areas 2202, 2204, and 2206>the reflectance in the BM area 2201. In the areas 2203, 2205, and 2207, the reflectance in the area including the color filter (green) (CF(G)) is particularly high. Although depending on panel design, the display quality of the panel is considered to become more adversely affected as the sizes of the regions occupied by the areas 2203, 2205, and 2207 increase.

REFERENCE

Patent Document

[Patent Document 1] Japanese Published Patent Application No. 2007-012370

SUMMARY OF THE INVENTION

An object of one embodiment of the present invention is to reduce reflection of external light in display devices.

In one embodiment of the present invention, the structure of a partition formed in a non-light-emitting region is improved to reduce surface reflection in the non-light-emitting region. Specifically, in one embodiment of the present invention, the optical length of the partition in the non-light-emitting region is adjusted so that the partition weakens external light that is incident through a coloring layer.

One embodiment of the present invention is a display device that includes a reflective electrode; a transparent electrode formed over the reflective electrode; a partition formed over the transparent electrode to surround the transparent electrode and the reflective electrode; a layer containing a light-emitting organic compound and formed over the partition and the transparent electrode; a semi-transmissive electrode formed over the layer containing the light-emitting organic compound; and a coloring layer over the semi-transmissive electrode. At least part of a light-emitting region is formed to overlap with the transparent electrode, the layer containing the light-emitting organic compound, the semi-transmissive electrode, and the coloring layer. At least part of a non-light-emitting region is formed to overlap with the transparent electrode, the partition, the layer containing the light-emitting organic compound, and the coloring layer. The non-light-emitting region is formed to surround the light-emitting region. The sum of the optical length of the transparent electrode and the optical length of the layer containing the light-emitting organic compound is adjusted to fulfil a condition of a microcavity intensifying light of the color of the coloring layer. The optical length of the partition in the non-light-emitting region is adjusted to weaken external light incident through the coloring layer.

In the above embodiment of the present invention, the optical length of the partition (the product of the thickness and refractive index of the partition) in the non-light-emitting region is preferably adjusted to a multiple of a ½ wavelength of the wavelength of the color of the coloring layer. The wavelength of the color of the coloring layer is a wavelength of the light which can be transmitted through the coloring layer.

One embodiment of the present invention is a display device that includes a reflective electrode; a transparent electrode formed over the reflective electrode; a partition formed to surround the transparent electrode and the reflective electrode; a layer containing a light-emitting organic compound and formed over the transparent electrode; a semi-transmissive electrode formed over the layer containing the light-emitting organic compound; and a coloring layer over the semi-transmissive electrode and the partition. The partition is a stacked-layer film including a first insulating layer and a second insulating layer with different refractive indices. At least part of a light-emitting region is formed to overlap with the transparent electrode, the layer containing the light-emitting organic compound, the semi-transmissive electrode, and the coloring layer. At least part of a non-light-emitting region is formed to overlap with the transparent electrode, the partition, the layer containing the light-emitting organic compound, and the coloring layer. The non-light-emitting region is formed to surround the light-emitting region. The sum of the optical length of the transparent electrode and the optical length of the layer containing the light-emitting organic compound is adjusted to fulfil a condition of a microcavity intensifying light of the color of the coloring layer. The optical length of the second insulating layer in the non-light-emitting region is adjusted to weaken external light incident through the coloring layer.

In the above embodiment of the present invention, when the refractive index of the first insulating layer is smaller than the refractive index of the second insulating layer, the optical length of the second insulating layer (the product of the thickness and refractive index of the second insulating layer) is preferably adjusted to the sum of the optical length of the transparent electrode and the wavelength of the color of the coloring layer multiplied by (2N−1)/4 (N is a natural number). When the refractive index of the first insulating layer is larger than the refractive index of the second insulating layer, the optical length of the second insulating layer is preferably adjusted to the sum of the optical length of the transparent electrode and a multiple of a ½ wavelength of the wavelength of the color of the coloring layer.

Note that a difference between the refractive index of the first insulating layer and the refractive index of the second insulating layer is preferably 0.1 or more.

Further, in the above embodiment, the color of the coloring layer is preferably green.

One embodiment of the present invention is a display device that includes a first reflective electrode and a second reflective electrode; a first transparent electrode formed over the first reflective electrode; a second transparent electrode formed over the second reflective electrode; a first partition formed over the first transparent electrode to surround the first reflective electrode and the first transparent electrode; a second partition formed over the second transparent electrode to surround the second reflective electrode and the second transparent electrode; a layer containing a light-emitting organic compound and formed over the first partition, the second partition, the first transparent electrode, and the second transparent electrode; a semi-transmissive electrode formed over the layer containing the light-emitting organic compound; and a first coloring layer and a second coloring layer over the semi-transmissive electrode. At least part of a first light-emitting region is formed to overlap with the first transparent electrode, the layer containing the light-emitting organic compound, the semi-transmissive electrode, and the first coloring layer. At least part of a first non-light-emitting region is formed to overlap with the first transparent electrode, the first partition, the layer containing the light-emitting organic compound, and the first coloring layer. The first non-light-emitting region is formed to surround the first light-emitting region. The sum of the optical length of the first transparent electrode and the optical length of the layer containing the light-emitting organic compound is adjusted to fulfil a condition of a microcavity intensifying light of the color of the first coloring layer. The optical length of the first partition is adjusted to weaken external light incident through the first coloring layer. At least part of a second light-emitting region is formed to overlap with the second transparent electrode, the layer containing the light-emitting organic compound, the semi-transmissive electrode, and the second coloring layer. At least part of a second non-light-emitting region is formed to overlap with the second transparent electrode, the second partition, the layer containing the light-emitting organic compound, and the second coloring layer. The second non-light-emitting region is formed to surround the second light-emitting region. The sum of the optical length of the second transparent electrode and the optical length of the layer containing the light-emitting organic compound is adjusted to fulfil a condition of a microcavity intensifying light of the color of the second coloring layer. The optical length of the second partition is adjusted to weaken external light incident through the second coloring layer.

In the above embodiment of the present invention, the optical length of the first partition (the product of the thickness of the first partition and the refractive index of the first partition) is preferably adjusted to a multiple of a ½ wavelength of the wavelength of the color of the first coloring layer. The optical length of the second partition (the product of the thickness of the second partition and the refractive index of the second partition) is preferably adjusted to a multiple of a ½ wavelength of the wavelength of the color of the second coloring layer.

In the above embodiment of the present invention, it is preferable that the first partition include a first insulating layer, and the optical length of the first insulating layer (the product of the thickness and refractive index of the first insulating layer) be adjusted to a multiple of the ½ wavelength of the wavelength of the color of the first coloring layer. It is preferable that the second partition include a stacked-layer film including the first insulating layer and a second insulating layer, and the sum of the optical length of the second insulating layer (the product of the thickness and refractive index of the second insulating layer) and the optical length of the first insulating layer that is the optical length of the second partition be adjusted to a multiple of the ½ wavelength of the wavelength of the color of the second coloring layer.

In the above embodiment of the present invention, the display device preferably includes a light-blocking portion that is formed over the semi-transmissive electrode and between the first coloring layer and the second coloring layer.

One embodiment of the present invention is an electronic device including the display device.

One embodiment of the present invention is a manufacturing method of a display device that includes a step of forming a transparent electrode over a reflective electrode; a step of forming a partition surrounding the transparent electrode and the reflective electrode over the transparent electrode; a step of forming a layer containing a light-emitting organic compound over the partition and the transparent electrode; a step of forming a semi-transmissive electrode over the layer containing the light-emitting organic compound; and a step of placing a coloring layer over the semi-transmissive electrode. At least part of a light-emitting region is formed to overlap with the transparent electrode, the layer containing the light-emitting organic compound, the semi-transmissive electrode, and the coloring layer. At least part of a non-light-emitting region is formed to overlap with the transparent electrode, the partition, the layer containing the light-emitting organic compound, and the coloring layer. The sum of the optical length of the transparent electrode and the optical length of the layer containing the light-emitting organic compound is adjusted to fulfil a condition of a microcavity intensifying light of the color of the coloring layer. The optical length of the partition in the non-light-emitting region is adjusted to weaken external light incident through the coloring layer.

In the above embodiment of the present invention, the optical length of the partition (the product of the thickness and refractive index of the partition) in the non-light-emitting region is preferably adjusted to a multiple of a ½ wavelength of the wavelength of the color of the coloring layer.

One embodiment of the present invention is a manufacturing method of a display device that includes a step of forming a transparent electrode over a reflective electrode; a step of forming a partition including a first insulating layer and a second insulating layer with different refractive indices and surrounding the transparent electrode and the reflective electrode over the transparent electrode; a step of forming a layer containing a light-emitting organic compound over the partition and the transparent electrode; a step of forming a semi-transmissive electrode over the layer containing the light-emitting organic compound; and a step of placing a coloring layer over the semi-transmissive electrode. At least part of a light-emitting region is formed to overlap with the transparent electrode, the layer containing the light-emitting organic compound, the semi-transmissive electrode, and the coloring layer. At least part of a non-light-emitting region is formed to overlap with the transparent electrode, the partition, the layer containing the light-emitting organic compound, and the coloring layer. The non-light-emitting region is formed to surround the light-emitting region. The sum of the optical length of the transparent electrode and the optical length of the layer containing the light-emitting organic compound is adjusted to fulfil a condition of a microcavity intensifying light of the color of the coloring layer. The optical length of the second insulating layer in the non-light-emitting region is adjusted to weaken external light incident through the coloring layer.

In the above embodiment of the present invention, when the refractive index of the first insulating layer is smaller than the refractive index of the second insulating layer, the optical length of the second insulating layer (the product of the thickness and refractive index of the second insulating layer) is preferably adjusted to the sum of the optical length of the transparent electrode and the wavelength of the color of the coloring layer multiplied by $(2N-1)/4$ (N is a natural number). When the refractive index of the first insulating layer is larger than the refractive index of the second insulating layer, the optical length of the second insulating layer is preferably adjusted to the sum of the optical length of the transparent electrode and a multiple of a ½ wavelength of the wavelength of the color of the coloring layer.

One embodiment of the present invention is a manufacturing method of a display device that includes a step of forming a first reflective electrode in a first light-emitting region and a first non-light-emitting region surrounding the first light-emitting region, and forming a second reflective electrode in a second light-emitting region and a second non-light-emitting region surrounding the second light-emitting region; a step of forming a first transparent electrode over the first reflective electrode, and forming a second transparent electrode over the second reflective electrode; a step of forming a partition with a first thickness over the first transparent electrode and the second transparent electrode; a step of forming a first photoresist over the partition in the first non-light-emitting region; a step of etching the partition with the first photoresist as a mask to keep the first thickness of the partition in the first non-light-emitting region and to make the partition in the second non-light-emitting region have a second thickness smaller than the first thickness; a step of removing the first photoresist; a step of forming a second photoresist over the partition in each of the first non-light-emitting region and the second non-light-emitting region; a step of etching the partition with the second photoresist as a mask to remove the partition in each of the first light-emitting region and the second light-emitting region; a step of removing the second photoresist; a step of forming a layer containing a light-emitting organic compound over the partition, the first transparent electrode, and the second transparent electrode; a step of forming a semi-transmissive electrode over the layer containing the light-emitting organic compound; and a step of placing a first coloring layer and a second coloring layer over the semi-transmissive electrode.

One embodiment of the present invention is a manufacturing method of a display device that includes a step of forming a first reflective electrode in a first light-emitting region and a first non-light-emitting region surrounding the first light-emitting region, and forming a second reflective electrode in a second light-emitting region and a second non-light-emitting region surrounding the second light-emitting region; a step of forming a first transparent electrode over the first reflective electrode, and forming a second transparent electrode over the second reflective electrode; a step of forming a first insulating layer over the first transparent electrode in the first non-light-emitting region and over the second transparent electrode in the second non-light-emitting region; a step of forming a second insulating layer over the first insulating layer in the second non-light-emitting region; a step of forming a layer containing a light-emitting organic compound over the first insulating layer in the first non-light-emitting region, the second insulating layer in the second non-light-emitting region, the first transparent electrode in the first light-emitting region, and the second transparent electrode in the second light-emitting region; a step of forming a semi-transmissive electrode over the layer containing the light-emitting organic compound; and a step of placing a first coloring layer and a second coloring layer over the semi-transmissive electrode. The first insulating layer and the second insulating layer form a partition.

In the above embodiment of the present invention, the first light-emitting region is preferably a region at least part of which overlaps with the first transparent electrode, the layer containing the light-emitting organic compound, the semi-transmissive electrode, and the first coloring layer. The first non-light-emitting region is preferably a region at least part of which overlaps with the first transparent electrode, the partition, the layer containing the light-emitting organic compound, and the first coloring layer. The sum of the optical length of the first transparent electrode and the optical length of the layer containing the light-emitting organic compound in the first light-emitting region is preferably adjusted to fulfil a condition of a microcavity intensifying light of the color of the first coloring layer. The optical length of the partition in the first non-light-emitting region is preferably adjusted to weaken external light incident through the first coloring layer. The second light-emitting region is preferably a region at least part of which overlaps with the second transparent electrode, the layer containing the light-emitting organic compound, the semi-transmissive electrode, and the second coloring layer. The second non-light-emitting region is preferably a region at least part of which overlaps with the second transparent electrode, the partition, the layer containing the light-emitting organic compound, and the second coloring layer. The sum of the thickness of the second transparent electrode and the thickness of the layer containing the light-emitting organic compound in the second light-emitting region is preferably adjusted to fulfil a condition of a microcavity intensifying light of the color of the second coloring layer. The optical length of the partition in the second non-light-emitting region is preferably adjusted to weaken external light incident through the second coloring layer.

In the above embodiment of the present invention, the optical length of the partition (the product of the thickness of the partition and the refractive index of the partition) in the first non-light-emitting region is preferably adjusted to a multiple of a ½ wavelength of the wavelength of the color of the first coloring layer. The optical length of the partition (the product of the thickness of the partition and the refractive index of the partition) in the second non-light-emitting region is preferably adjusted to a multiple of a ½ wavelength of the wavelength of the color of the second coloring layer.

By application of one embodiment of the present invention, a display device having high display quality by reducing reflection of external light, or a manufacturing method of the display device can be provided.

DETAILED DESCRIPTION OF THE INVENTION

Hereinafter, embodiments of the present invention will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

Embodiment 1

In this embodiment, a display device of one embodiment of the present invention will be described with reference to FIGS. 1A and 1B.

Figure 1A:
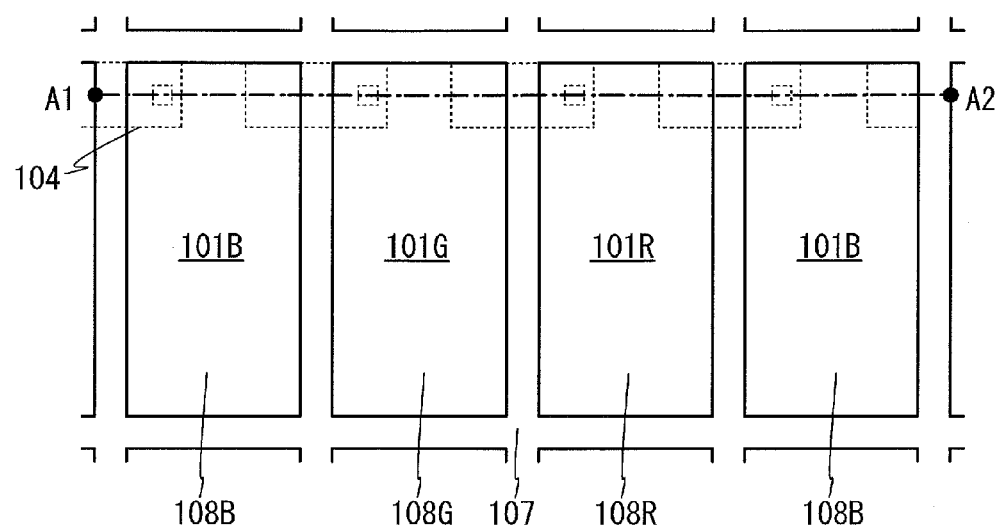
FIGS. 1A and 1B illustrate a display device of one embodiment of the present invention.
Figure 1B:
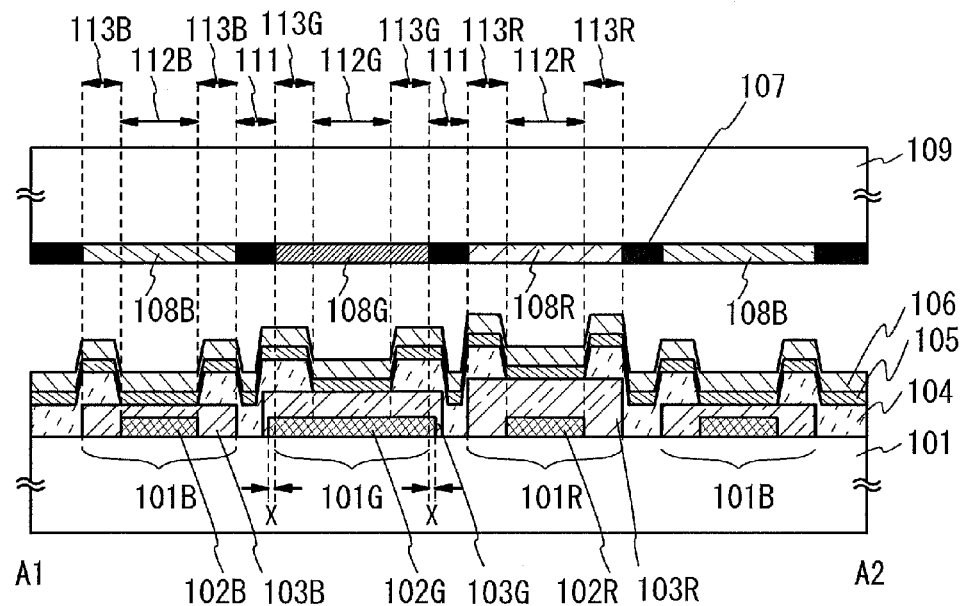

A structure example of a display device in this embodiment is illustrated in FIGS. 1A and 1B. FIG. 1A is a top view illustrating part of a pixel region of the display device, and FIG. 1B is a cross-sectional view taken along dashed-dotted line A1-A2 in FIG. 1A. Note that for simplification of the drawing, some components are illustrated in a see-through manner or not illustrated in the top view in FIG. 1A.

FIG. 1A illustrates part of the pixel region of the display device, in which pixel patterns of a pixel portion (blue), a pixel portion (green), and a pixel portion (red) are arranged in matrix, for example, and each pixel pattern includes an unshown thin film transistor (TFT) which serves as a switching element for switching an on state and an off state of a pixel portion. Note that although the pixel patterns of three colors, i.e., the pixel patterns of the pixel portion (blue), the pixel portion (green), and the pixel portion (red) are described as examples, pixel patterns of four or more colors may be alternatively employed.

In this embodiment, each pixel pattern includes a pixel portion (blue) 101B, a pixel portion (green) 101G, and a pixel portion (red) 101R. Between the pixel patterns, a light-blocking portion 107 serving as a black matrix (BM) is formed.

The display device illustrated in FIGS. 1A and 1B includes a first substrate 101 and a second substrate 109. An element portion including the unshown TFTs, a light-emitting element, and the like are formed over the first substrate 101. A coloring layer serving as what is called a color filter, and the like are provided on the second substrate 109. Note that the first substrate 101 and the second substrate 109, which face each other, are sealed such that there is a space therebetween. Although not shown in FIGS. 1A and 1B, a wiring pattern or the like which is electrically connected to the TFT may be further provided.

When external light enters the display device, the external light is reflected off a glass substrate surface of the pixel region, an interface with the light-emitting element formed in the pixel region, or a surface of a reflective electrode or the like, for example. By a reduction in reflection of external light in the pixel portion, a display device with high display quality can be provided. Specifically, it is effective to reduce the reflectance in a region where strong reflection of external light occurs in the pixel portion.

In this embodiment, for example, a structure illustrated in FIG. 1B can be employed to reduce the above-described reflection of external light. With reference to FIG. 1B, description is given of a display device that has a structure for reducing the reflectance in a non-light-emitting region 113G of the pixel portion (green) 101G, in which the surface reflection of external light is particularly strong as compared to those in non-light-emitting regions 113B and 113R of the pixel portion (blue) 101B and the pixel portion (red) 101R.

Note that in the description below, a BM region 111 in which the light-blocking portion 107 blocks light, light-emitting regions 112B, 112G, and 112R and the non-light-emitting regions 113B, 113G, and 113R of the pixel portion (blue) 101B, the pixel portion (green) 101G, and the pixel portion (red) 101R are provided over a panel of the display device.

As shown in FIG. 1B, over the first substrate 101, the pixel portion (blue) 101B exhibiting blue light emission (e.g., a wavelength of 450 nm to 485 nm), the pixel portion (green) 101G exhibiting green light emission (e.g., a wavelength of 500 nm to 565 nm), and the pixel portion (red) 101R exhibiting red light emission (e.g., a wavelength of 600 nm to 740 nm) are formed.

In the pixel portion (blue) 101B exhibiting blue light emission, a light-emitting element which includes a first reflective electrode 102B for an anode, a first transparent electrode 103B for the anode, a layer 105 containing a light-emitting organic compound (hereinafter also referred to as "EL layer"), and a semi-transmissive electrode 106 for a cathode is provided. In the pixel portion (blue) 101B, there are the light-emitting region 112B where a color filter (blue) 108B overlaps with the first reflective electrode 102B, the first transparent electrode 103B, the EL layer 105, and the semi-transmissive electrode 106, and the non-light-emitting region 113B where a partition 104 overlaps with the first transparent electrode 103B, the EL layer 105, the semi-transmissive electrode 106, and the color filter (blue) 108B. The non-light-emitting region 113B surrounds the light-emitting region 112B.

In the pixel portion (green) 101G exhibiting green light emission, a light-emitting element that includes a second reflective electrode 102G for an anode, a second transparent electrode 103G for the anode, the EL layer 105, and the semi-transmissive electrode 106 for the cathode is provided. In the pixel portion (green) 101G, there are the light-emitting region 112G where a color filter (green) 108G overlaps with the second reflective electrode 102G, the second transparent electrode 103G, the EL layer 105, and the semi-transmissive electrode 106, and the non-light-emitting region 113G where the partition 104 overlaps with the second reflective electrode 102G, the second transparent electrode 103G, the EL layer 105, the semi-transmissive electrode 106, and the color filter (green) 108G. The non-light-emitting region 113G surrounds the light-emitting region 112G.

Note that in the pixel portion (green) 101G, a pattern of the second reflective electrode 102G of the light-emitting element is larger than the color filter (green) 108G (as expressed by X in FIG. 1B).

In the pixel portion (red) 101R exhibiting red light emission, a light-emitting element which includes a third reflective electrode 102R for an anode, a third transparent electrode 103R for the anode, the EL layer 105, and the semi-transmissive electrode 106 for the cathode is provided. In the pixel portion (red) 101R, there are the light-emitting region 112R where a color filter (red) 108R overlaps with the third reflective electrode 102R, the third transparent electrode 103R, the EL layer 105, and the semi-transmissive electrode 106, and the non-light-emitting region 113R where the partition 104 overlaps with the third transparent electrode 103R, the EL layer 105, the semi-transmissive electrode 106, and the color filter (red) 108R. The non-light-emitting region 113R surrounds the light-emitting region 112R.

Note that the partition 104 is provided between the anodes, which have stacked-layer structures of the first, second, and third reflective electrodes 102B, 102G, and 102R and the first, second, and third transparent electrodes 103B, 103G, and 103R in the pixel portions. End portions of the first, second, and third transparent electrodes 103B, 103G, and 103R are covered with the partition 104.

A green reflected light component in the non-light-emitting region 113G can be weakened by adjusting the sum of the thickness of the second transparent electrode 103G, the thickness of the partition 104, and the thickness of the EL layer 105 in the non-light-emitting region 113G of the pixel portion (green) 101G.

Specifically, in a WTC structure, the sum of the thickness of the second transparent electrode 103G and the thickness of the EL layer 105 in the pixel portion (green) 101G is set to fulfil a condition of a microcavity (micro optical resonator) intensifying green light. Therefore, when the optical length of the partition 104 (the thickness of the partition×the refractive index of the partition) in the non-light-emitting region 113G of the pixel portion (green) 101G (a region where the color filter (green) 108G overlaps with the partition 104) is set to be a multiple of (be N/2 times (N is a natural number)) a ½ wavelength of a green emission wavelength, a green reflected light component reflected off the second reflective electrode 102G and a green reflected light component reflected off the semi-transmissive electrode 106 weaken each other. Accordingly, a green reflected light component in the non-light-emitting region 113G can be weakened.

Note that the thickness of the partition 104 in each of the non-light-emitting region 113B of the pixel portion (blue) 101B and the non-light-emitting region 113R of the pixel portion (red) 101R is similar to the thickness of the partition 104 in the non-light-emitting region 113G of the pixel portion (green) 101G.

As a material of the partition 104, an inorganic insulating material which is advantageous in control of thickness of the order of nanometers (e.g., $SiO_x$, $SiN_x$, SiOC, SiNO, $TiO_2$, or ZnO) is preferably used.

It is preferable that the refractive index difference between the partition 104 and the EL layer 105 be made as small as possible and reflection at the interface be prevented.

With the above structure, the reflectance in the non-light-emitting region (green) 113G, in which the reflectance is higher than those in the non-light-emitting regions 113B and 113R, can be reduced; thus, reflected light in the whole panel can be reduced. Specifically, transmission of light other than green external light in the non-light-emitting region 113G can be reduced by the color filter (green) 108G, and reflection of the green external light transmitted through the color filter (green) 108G in the non-light-emitting region 113G can be reduced by the effect of interference of light.

Note that in the pixel portion (blue) 101B exhibiting blue light emission and the pixel portion (red) 101R exhibiting red light emission, a pattern of the first reflective electrode 102B and that of the third reflective electrode 102R of the light-emitting elements are preferably formed to have the same areas as the light-emitting region 112B and the light-emitting region 112R, respectively.

In a manner similar to the above, the reflectance in the pixel portion (blue) or the pixel portion (red) can also be reduced.

The structure described in this embodiment can be used in appropriate combination with any of the structures described in the other embodiments.

Embodiment 2

Figure 2:
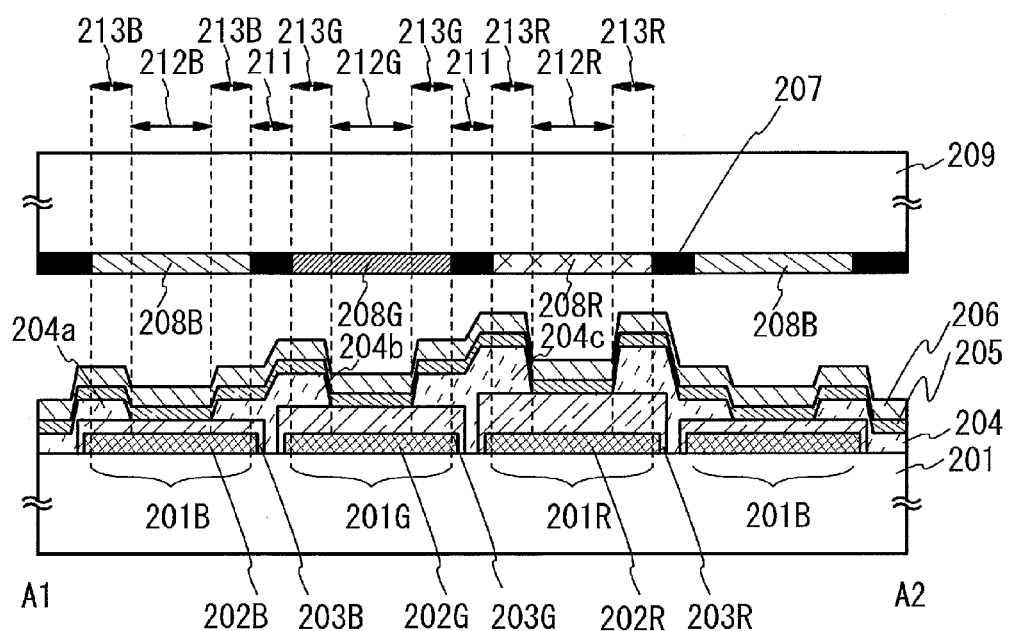
FIG. 2 illustrates a display device of one embodiment of the present invention.

In this embodiment, for example, a structure illustrated in FIG. 2 can be employed to reduce reflection of external light. FIG. 2 corresponds to a cross section taken along a dashed-dotted line A1-A2 in FIG. 1A.

With reference to FIG. 2, description is given of a display device which has a structure for reducing the surface reflectance of external light in a non-light-emitting region 213B of a pixel portion (blue) 201B, a non-light-emitting region 213G of a pixel portion (green) 201G, and a non-light-emitting region 213R of a pixel portion (red) 201R.

Note that in the description below, a BM region 211 in which a black matrix (BM) 207 blocks light, light-emitting regions 212B, 212G, and 212R and the non-light-emitting regions 213B, 213G, and 213R of the pixel portion (blue) 201B, the pixel portion (green) 201G, and the pixel portion (red) 201R are provided over a panel of the display device.

The display device illustrated in FIG. 2 includes a first substrate 201 and a second substrate 209 which are similar to the first substrate 101 and the second substrate 109 illustrated in FIG. 1B, respectively.

In the pixel portion (blue) 201B exhibiting blue light emission, a light-emitting element that includes a first reflective electrode 202B for an anode, a first transparent electrode 203B for the anode, an EL layer 205, and a semi-transmissive electrode 206 for a cathode is provided. In the pixel portion (blue) 201B, there are the light-emitting region 212B where a color filter (blue) 208B overlaps with the first reflective electrode 202B, the first transparent electrode 203B, the EL layer 205, and the semi-transmissive electrode 206, and the non-light-emitting region 213B where a partition 204 overlaps with the first reflective electrode 202B, the first transparent electrode 203B, the EL layer 205, the semi-transmissive electrode 206, and the color filter (blue) 208B. The non-light-emitting region 213B surrounds the light-emitting region 212B.

A second reflective electrode 202G for an anode, a second transparent electrode 203G for the anode, the EL layer 205, the semi-transmissive electrode 206 for the cathode, a color filter (green) 208G, the light-emitting region 212G, and the non-light-emitting region 213G are provided in the pixel portion (green) 201G exhibiting green light emission, as in the above pixel portion (blue) 201B.

A third reflective electrode 202R for an anode, a third transparent electrode 203R for the anode, the EL layer 205, the semi-transmissive electrode 206 for the cathode, a color filter (green) 208R, the light-emitting region 212R, and the non-light-emitting region 213R are provided in the pixel portion (red) 201R exhibiting red light emission, as in the above pixel portion (blue) 201B.

In a similar manner to that of the pixel portion (green) 101G described in Embodiment 1 with reference to FIG. 1B, the patterns of the first reflective electrode 202B, the second reflective electrode 202G, and the third reflective electrode 202R for the anodes in all of the pixel portion (blue) 201B, the pixel portion (green) 201G, and the pixel portion (red) 201R are formed to be larger than the color filter (blue) 208B, the color filter (green) 208G, and the color filter (red) 208R, respectively.

Further, the partition 204 is preferably formed using a plurality of inorganic insulating materials that can be selectively etched by dry etching.

Note that the partition 204 in the non-light-emitting regions has three thicknesses in this embodiment, so that the partition 204 has an optical function of reducing surface reflection in the non-light-emitting regions 213B, 213G, and 213R of the pixel portions in a similar manner to that of the partition 104 in the non-light-emitting region 113G of the pixel portion (green) 101G which is described in Embodiment 1 with reference to FIG. 1B. Parts of the partition which have different thicknesses are referred to as a first partition 204a, a second partition 204b, and a third partition 204c.

That is, by adjusting the sum of the thickness of the partition 204, the thickness of the EL layer 205, and the thickness of the first, second, or third transparent electrode 203B, 203G, or 203R in each of the non-light-emitting regions 213B, 213G, and 213R of the respective pixel portions, reflected light components of the respective colors in the non-light-emitting regions 213B, 213G, and 213R can be weakened.

Specifically, in a WTC structure, the sum of the thickness of the first, second, or third transparent electrode 203B, 203G, or 203R and the thickness of the EL layer 205 in each pixel portion is set to fulfil a condition of a microcavity (micro optical resonator) intensifying light of the color of each pixel portion. Therefore, reflected light components of the respective colors in the non-light-emitting regions 213B, 213G, and 213R can be weakened when the optical length of each of the parts of the partition 204 (the thickness of the part of the partition×the refractive index of the part of the partition) in the non-light-emitting regions 213B, 213G, and 213R of the pixel portions (regions where the color filter (blue) 208B, the color filter (green) 208G, and the color filter (red) 208R overlap with the partition 204) is set to be a multiple of (be N/2 times (N is a natural number)) a ½ wavelength of the wavelength of each color.

The first partition 204a in the non-light-emitting region 213B of the pixel portion (blue) 201B has a third thickness, the second partition 204b in the non-light-emitting region 213G of the pixel portion (green) 201G has a second thickness, and the third partition 204c in the non-light-emitting region 213R of the pixel portion (red) 201R has a first thickness. Note that the third thickness is set such that the optical length of the first partition 204a is a multiple of (is N/2 times (N is a natural number)) a ½ wavelength of blue light; the second thickness is set such that the optical length of the second partition 204b is a multiple of (is N/2 times (N is a natural number)) a ½ wavelength of green light; and the first thickness is set such that the optical length of the third partition 204c is a multiple of (is N/2 times (N is a natural number)) a ½ wavelength of red light.

Note that the first to third partitions 204a to 204c may have stacked-layer structures including three kinds of inorganic insulating materials. An example of this structure is as follows. The first partition 204a in the non-light-emitting region 213B of the pixel portion (blue) 201B is a first insulating layer, the second partition 204b in the non-light-emitting region 213G of the pixel portion (green) 201G is a stacked-layer film in which the first insulating layer and a second insulating layer are stacked, and the third partition 204c in the non-light-emitting region 213R of the pixel portion (red) 201R is a stacked-layer film in which the first insulating layer, the second insulating layer, and a third insulating layer are stacked. Note that the first insulating layer is designed such that its optical length (the thickness of the first insulating layer×the refractive index of the first insulating layer) is a multiple of (is N/2 times (N is a natural number)) a ½ wavelength of blue light; the stacked-layer film in which the first insulating layer and the second insulating layer are stacked is designed such that its optical length (the thickness of the first insulating layer×the refractive index of the first insulating layer+the thickness of the second insulating layer×the refractive index of the second insulating layer) is a multiple of (is N/2 times (N is a natural number)) a ½ wavelength of green light; and the stacked-layer film in which the first insulating layer, the second insulating layer, and the third insulating layer are stacked is designed such that its optical length (the thickness of the first insulating layer×the refractive index of the first insulating layer+the thickness of the second insulating layer×the refractive index of the second insulating layer+the thickness of the third insulating layer×the refractive index of the third insulating layer) is a multiple of (is N/2 times (N is a natural number)) a ½ wavelength of red light.

Note that when the thickness of the first insulating layer is smaller than that of the second transparent electrode 203G of the pixel portion (green) 201G or the third transparent electrode 203R of the pixel portion (red) 201R, design is performed such that the optical length of the stacked-layer film is set to 1 wavelength. In that case, the stacked-layer film in which the first insulating layer and the second insulating layer are stacked is designed such that its optical length is set to 1 wavelength of green light; and the stacked-layer film in which the first insulating layer, the second insulating layer, and the third insulating layer are stacked is designed such that its optical length is set to 1 wavelength of red light.

As specific examples of an inorganic insulating material that can be used for the partition 204, $SiO_x$, $SiN_x$, SiOC, SiNO, $TiO_2$, and ZnO can be given. Any of these inorganic insulating materials are preferably used, in which case thickness can be precisely controlled by dry etching.

It is preferable that the refractive index difference between the partition 204 and the EL layer 205 be made as small as possible and reflection at the interface be prevented.

According to the above description, when the first partition 204a in the non-light-emitting region 213B is formed to have the third thickness, the second partition 204b in the non-light-emitting region 213G is formed to have the second thickness, and the third partition 204c in the non-light-emitting region 213R is formed to have the first thickness, reflection of external light in the non-light-emitting regions 213B, 213G, and 213R of the pixel portions 201B, 201G, and 201R can be reduced.

The structure described in this embodiment can be used in appropriate combination with any of the structures described in the other embodiments.

Embodiment 3

Figure 3:
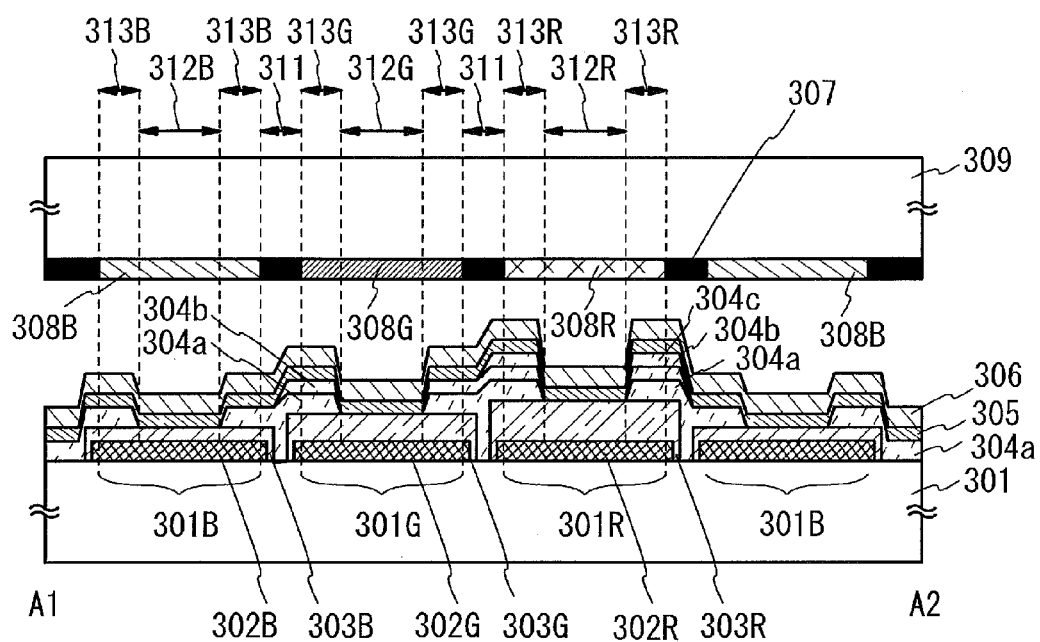
FIG. 3 illustrates a display device of one embodiment of the present invention.

In this embodiment, thicknesses of the first partition 204a, the second partition 204b, and the third partition 204c in the pixel portions 201B, 201G, and 201R which are described in Embodiment 2 are adjusted by mask vapor deposition. The description will be made with reference to FIG. 3. FIG. 3 corresponds to a cross section taken along a dashed-dotted line A1-A2 in FIG. 1A.

Note that in the description below, a color filter (blue) 308B, a color filter (green) 308G, a color filter (red) 308R, a BM region 311 in which a black matrix (BM) 307 blocks light, light-emitting regions 312B, 312G, and 312R and non-light-emitting regions 313B, 313G, and 313R of a pixel portion (blue) 301B, a pixel portion (green) 301G, and a pixel portion (red) 301R are provided over a panel of a display device.

The display device illustrated in FIG. 3 includes a first substrate 301 and a second substrate 309 which are similar to the first substrate 101 and the second substrate 109 illustrated in FIG. 1B, respectively.

First, a first insulating layer 304a of a partition is designed to have an optical length (the thickness of the first insulating layer 304a×the refractive index of the first insulating layer 304a) which is set to a ½ wavelength of blue light. The first insulating layer 304a is formed in such a manner that a film is formed entirely and etched to remain in only partition regions in the non-light-emitting regions 313B, 313G, and 313R and the BM region 311. Note that when the thickness of the first insulating layer 304a is smaller than that of each of a second transparent electrode 303G for an anode in the pixel portion (green) 301G and a third transparent electrode 303R for an anode in the pixel portion (red) 301R, design is performed such that the optical length of the first insulating layer is set to 1 wavelength.

Next, another film is formed using a mask having a pattern that allows vapor deposition only in the partition portions of the pixel portion (green) 301G and the pixel portion (red) 301R; thus, a second insulating layer 304b is formed. Another film is formed using a mask having a pattern that allows vapor deposition only in the partition portion of the pixel portion (red) 301R; thus, a third insulating layer 304c is formed. The stacked-layer film in which the first insulating layer 304a and the second insulating layer 304b are stacked is designed such that its optical length (the thickness of the first insulating layer 304a×the refractive index of the first insulating layer 304a+ the thickness of the second insulating layer 304b×the refractive index of the second insulating layer 304b) is a multiple of (is N/2 times (N is a natural number)) a ½ wavelength of green light; and the stacked-layer film in which the first insulating layer 304a, the second insulating layer 304b, and the third insulating layer 304c are stacked is designed such that its optical length (the thickness of the first insulating layer 304a× the refractive index of the first insulating layer 304a+the thickness of the second insulating layer 304b×the refractive index of the second insulating layer 304b+the thickness of the third insulating layer 304c×the refractive index of the third insulating layer 304c) is a multiple of (is N/2 times (N is a natural number)) a ½ wavelength of red light. Thus, reflection in the non-light-emitting regions (313B, 313G, and 313R) can be reduced in all of the pixel portions 301B, 301G, and 301R.

Note that first, second, and third reflective electrodes 302B, 302G, and 302R for the anodes, a first transparent electrode 303B, the second transparent electrode 303G, and the third transparent electrode 303R for the anodes, an EL layer 305, and a semi-transmissive electrode 306 for a cathode are formed as in Embodiment 2.

The structure described in this embodiment can be used in appropriate combination with any of the structures described in the other embodiments.

Embodiment 4

Figure 4:
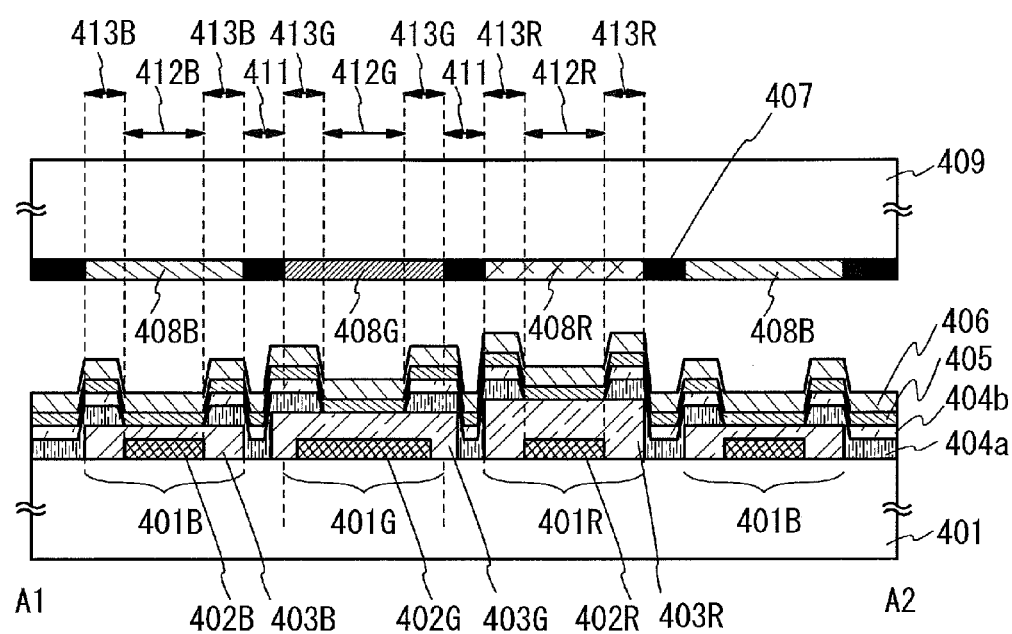
FIG. 4 illustrates a display device of one embodiment of the present invention.

In this embodiment, with reference to FIG. 4, description is given of a structure that is different from the structure in Embodiment 1 and that reduces the reflectance in a non-light-emitting region 413G of a pixel portion (green) 401G, in which the surface reflectance of external light is particularly high as compared to those in non-light-emitting regions 413B and 413R of pixel portions 401B and 401R. FIG. 4 corresponds to a cross section taken along a dashed-dotted line A1-A2 in FIG. 1A.

Note that in the description below, a color filter (blue) 408B, a color filter (green) 408G, a color filter (red) 408R, a BM region 411 in which a black matrix (BM) 407 blocks light, light-emitting regions 412B, 412G, and 412R and the non-light-emitting regions 413B, 413G, and 413R of the pixel portion (blue) 401B, pixel portion (green) 401G, and pixel portion (red) 401R are provided over a panel of a display device.

The display device illustrated in FIG. 4 includes a first substrate 401 and a second substrate 409 which are similar to the first substrate 101 and the second substrate 109 illustrated in FIG. 1B, respectively.

In the display device illustrated in FIG. 4, the pixel portion (blue) 401B exhibiting blue light emission, the pixel portion (green) 401G exhibiting green light emission, and the pixel portion (red) 401R exhibiting red light emission are formed over the first substrate 401. The pixel portion 401B includes a light-emitting element including a first reflective electrode 402B for an anode, a first transparent electrode 403B for the anode, an EL layer 405, and a semi-transmissive cathode 406; the pixel portion 401G includes a light-emitting element including a second reflective electrode 402G for an anode, a second transparent electrode 403G for the anode, the EL layer 405, and the semi-transmissive cathode 406; and the pixel portion 401R includes a light-emitting element including a third reflective electrode 402R for an anode, a third transparent electrode 403R for the anode, the EL layer 405, and the semi-transmissive cathode 406.

A partition described in this embodiment has a stacked-layer structure including a plurality of layers, for example, a two-layer structure that includes a first insulating layer 404a and a second insulating layer 404b as illustrated in FIG. 4. The refractive index difference is preferably as large as possible and at least 0.1 in order that light may be reflected off the interface between the first insulating layer 404a and the second insulating layer 404b.

This partition with the two-layer structure is provided between the anodes, which have stacked-layer structures of the first, second, and third reflective electrodes 402B, 402G, and 402R and the first, second, and third transparent electrodes 403B, 403G, and 403R in the pixel portions. End portions of the first, second, and third transparent electrodes 403B, 403G, and 403R are covered with the partition.

In this embodiment, light reflected off the interface in the partition (e.g., light reflected off the interface between the first insulating layer 404a and the second insulating layer 404b) and light reflected off the semi-transmissive electrode 406 weaken each other; thus, the partition works synergistically with the color filters, reducing the reflectance of external light. In other words, transmission of light other than light of the color of the color filter can be reduced by the color filter, and reflection of the light of the color of the color filter transmitted through the color filter can be reduced by the effect of interference of light.

In addition, the structure in this embodiment is advantageous in less limitations on the process because the above-described effects can be achieved regardless of whether or not the partition overlaps with the first, second, and third transparent electrodes 403B, 403G, and 403R and the first, second, and third reflective electrodes 402B, 402G, and 402R.

Note that specific examples of a high refractive index material that can be used for one of the first insulating layer 404a and the second insulating layer 404b include $TiO_2$, and those of a low refractive index material that can be used for the other of the first insulating layer 404a and the second insulating layer 404b include $SiO_x$, SiN, and SiON.

The optical length of the second insulating layer 404b is adjusted in accordance with the refractive index relationship between the first insulating layer 404a and the second insulating layer 404b. When the refractive index of the first insulating layer 404a is smaller than that of the second insulating layer 404b, the optical length of the second insulating layer 404b is adjusted to the sum of the optical length of the second transparent electrode 403G and a green wavelength multiplied by (2N−1)/4 (N is a natural number). When the refractive index of the first insulating layer 404a is larger than that of the second insulating layer 404b, the optical length of the second insulating layer 404b is adjusted to the optical length of the second transparent electrode 403G or the sum of the optical length of the second transparent electrode 403G and a multiple of a ½ wavelength of a green wavelength (a ½ wavelength of a green wavelength multiplied by N/2 (N is a natural number)).

As a material for the partition in this embodiment, an inorganic insulating layer is preferably used. This is because control of thickness of the order of nanometers is difficult when an organic insulating material such as a resin is used.

With the above structure, the reflectance in the non-light-emitting region 413G of the pixel portion (green) 401G, in which the reflectance is higher than those in the non-light-emitting regions 413B and 413R, can be reduced; thus, reflected light in the whole panel can be reduced.

In a manner similar to the above, the reflectance in the pixel portion (blue) or the pixel portion (red) can also be reduced.

The structure described in this embodiment can be used in appropriate combination with any of the structures described in the other embodiments.

Furthermore, one embodiment of the present invention can be applied to electronic devices having the display device described above.

Embodiment 5

In this embodiment, an example of a method for manufacturing a display device of one embodiment of the present invention will be described. Specifically, a method for manufacturing the display device in Embodiment 1 will be described with reference to FIGS. 5A to 5D.

Figure 5A:
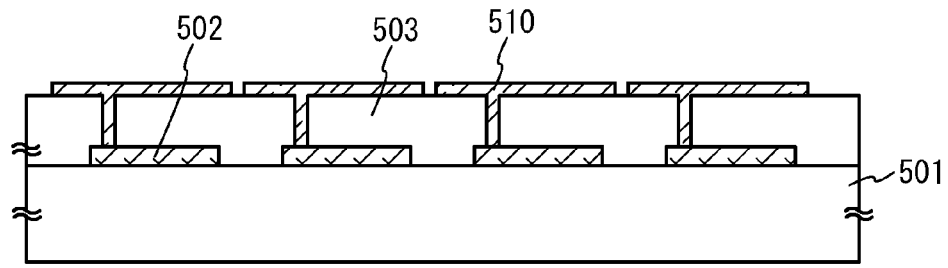
FIGS. 5A to 5D illustrate a method for manufacturing a display device of one embodiment of the present invention.

As illustrated in FIG. 5A, a thin film transistor (TFT) 502, a planarization layer 503, and a wiring 510 are formed over a first substrate 501 by a known method. For example, after the formation of the planarization layer 503, a transparent conductive film made of ITO ($In_2O_3$ doped with $SnO_2$) is formed by a known sputtering method and patterned into a desired shape, whereby the wiring 510 electrically connected to the TFT 502 can be formed.

Figure 5B:
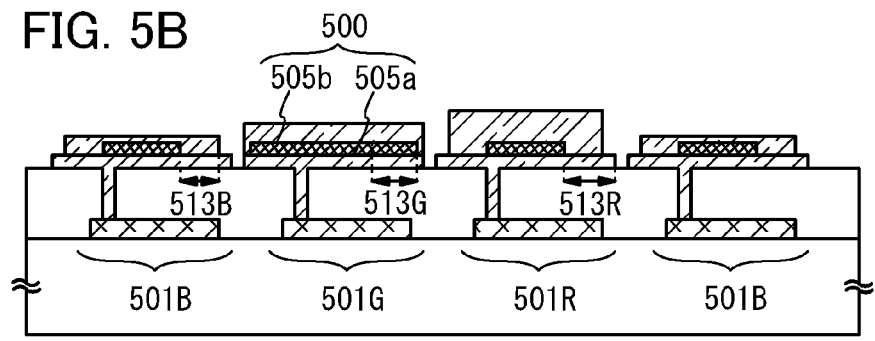

Then, as illustrated in FIG. 5B, an anode 500 electrically connected to the wiring 510 is formed. The anode 500 is a stack including a reflective electrode 505a and a transparent electrode 505b. The reflective electrode 505a is preferably formed using a high reflectance material; for example, silver, a silver alloy, or the like is used. To improve efficiency and color purity of an emission color in each of pixel portions 501B, 501G, and 501R, the transparent electrode 505b is formed to a thickness suitable for the emission color. For example, the transparent electrode 505b in the pixel portion (blue) 501B exhibiting blue light emission can be 5-nm-thick ITO, the transparent electrode 505b in the pixel portion (green) 501G exhibiting green light emission can be 45-nm-thick ITO, and the transparent electrode 505b in the pixel portion (red) 501R exhibiting red light emission can be 85-nm-thick ITO. Note that the transparent electrode 505b may be a stack including different kinds of transparent conductive films instead of a single film. In this embodiment, only the reflective electrode 505a in the pixel portion (green) 501G exhibiting green light emission is also formed in the non-light-emitting region (513G).

Figure 5C:
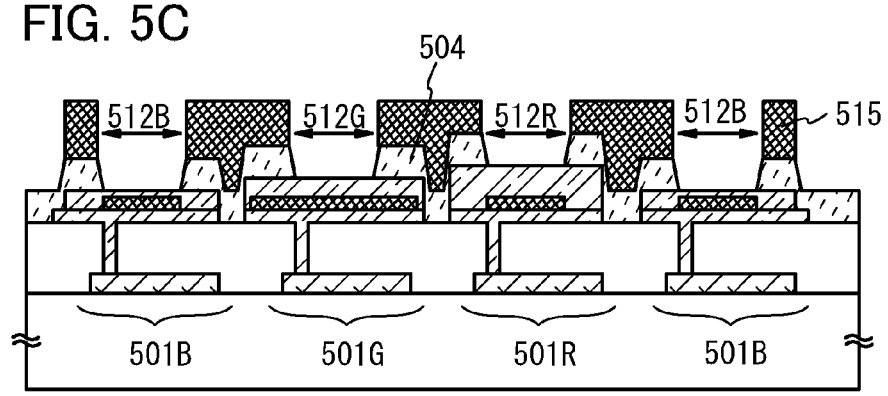

Next, as illustrated in FIG. 5C, a partition 504 made of an inorganic film is formed. At the time of the formation of the partition 504, a first photoresist 515 that is commercially available is formed into a predetermined pattern by a known method, and the partition 504 is patterned by etching. The patterning is performed such that the partition 504 overlaps with an edge of the anode 500 in the non-light-emitting region 513G of the pixel portion (green) 501G exhibiting green light emission. The patterning is preferably performed such that an edge of the partition 504 and an edge of the reflective electrode 505a are placed at the same position in each of the pixel portion (blue) 501B exhibiting blue light emission and the pixel portion (red) 501R exhibiting red light emission.

Note that the optical length of the partition 504 is adjusted to be a multiple of (be N/2 times (N is a natural number)) a ½ wavelength of a green emission wavelength. For example, a film made of $SiO_2$ with a refractive index of 1.5 is formed to a thickness of 173 nm.

Through the above steps, light-emitting regions 512B, 512G, and 512R of the pixel portions 501B, 501G, and 501R are formed.

Figure 5D:
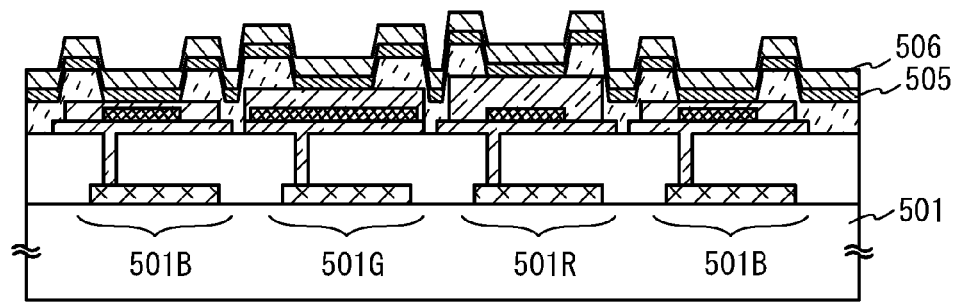

Then, as illustrated in FIG. 5D, an EL layer 505 and a semi-transmissive electrode 506 are sequentially formed over the anode 500 and the partition 504. Here, the EL layer 505 may have a stacked-layer structure and preferably has a structure that enables white light to be emitted by utilizing a microcavity structure.

Note that when the first substrate 501 obtained by the step illustrated in FIG. 5D and a second substrate provided with color filters a black matrix are fitted with each other to be sealed, a display device having the structure described in Embodiment 1 can be manufactured.

The structure described in this embodiment can be used in appropriate combination with any of the structures described in the other embodiments.

Embodiment 6

In this embodiment, an example of a method for manufacturing an element structure of one embodiment of the present invention will be described. Specifically, a method for manufacturing the element structure in Embodiment 2 will be described with reference to FIGS. 6A to 6D and FIGS. 7A and 7B.

Figure 6A:
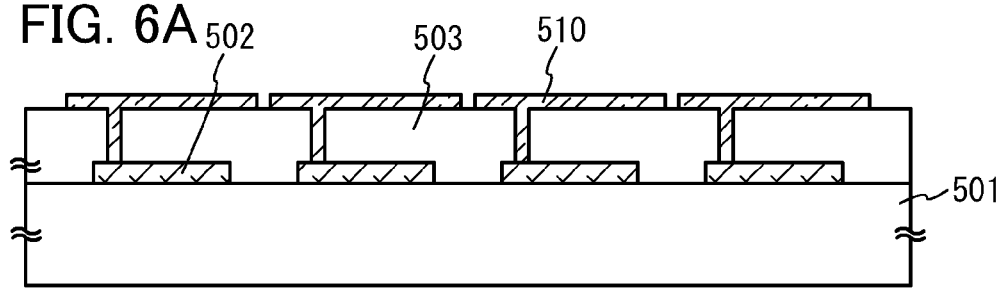
FIGS. 6A to 6D illustrate a method for manufacturing a display device of one embodiment of the present invention.

As illustrated in FIG. 6A, the thin film transistors (TFT) 502, the planarization layer 503 that is an insulating layer, and the wirings 510 are formed over the first substrate 501 by a known method. For example, after the formation of the planarization layer 503, a transparent conductive film made of ITO ($In_2O_3$ doped with $SnO_2$) is formed by a known sputtering method and patterned into a desired shape, whereby the wirings 510 electrically connected to the TFTs 502 can be formed.

Figure 6B:
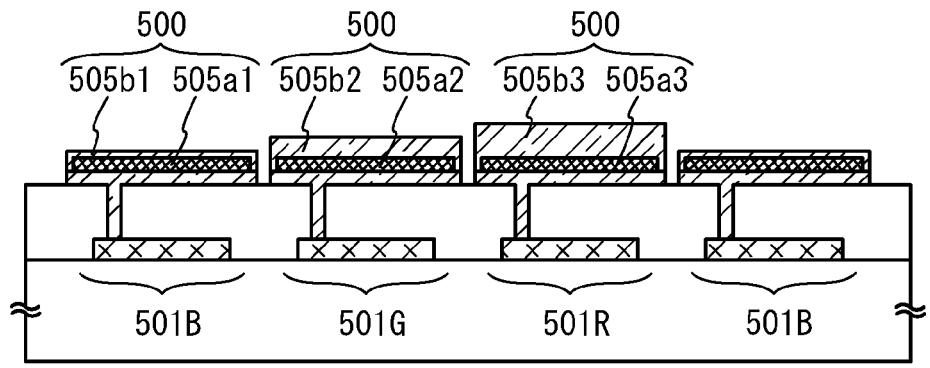

Then, as illustrated in FIG. 6B, the anodes 500 electrically connected to the wirings 510 are formed. The anodes 500 are a stack including a first reflective electrode 505a1 and a first transparent electrode 505b1, a stack including a second reflective electrode 505a2 and a second transparent electrode 505b2, and a stack including a third reflective electrode 505a3 and a third transparent electrode 505b3. The first, second, and third reflective electrodes 505a1, 505a2, and 505a3 are preferably formed using a high reflectance material; for example, silver, a silver alloy, or the like is used. To improve efficiency and color purity of an emission color in each of the pixel portions 501B, 501G, and 501R, the first, second, and third transparent electrodes 505b1, 505b2, and 505b3 are each formed to a thickness suitable for the emission color. For example, the first transparent electrode 505b1 in the pixel portion (blue) 501B exhibiting blue light emission can be 5-nm-thick ITO, the second transparent electrode 505b2 in the pixel portion (green) 501G exhibiting green light emission can be 45-nm-thick ITO, and the third transparent electrode 505b3 in the pixel portion (red) 501R exhibiting red light emission can be 85-nm-thick ITO. Note that the first, second, and third transparent electrodes 505b1, 505b2, and 505b3 may each be a stack including different kinds of transparent conductive films instead of a single film.

Figure 6C:
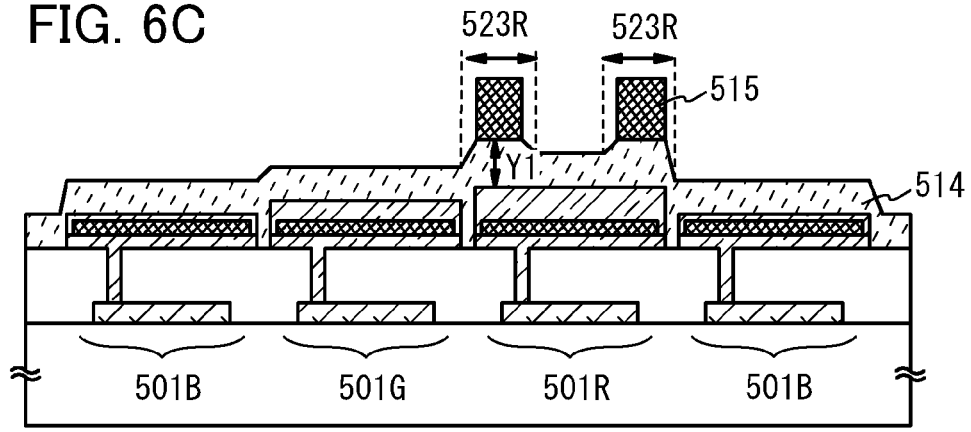

Then, as illustrated in FIG. 6C, a partition 514 having a first thickness Y1 and made of an inorganic film is formed over the entire region that includes the anodes 500. A first photoresist 515 is patterned in a non-light-emitting region 523R of the pixel portion (red) 501R exhibiting red light emission, and the partition 514 is etched using the first photoresist 515 as a mask. In this manner, the partition 514 in the non-light-emitting region 523R of the pixel portion (red) 501R exhibiting red light emission remains to have the first thickness Y1 while the partition 514 in a non-light-emitting region 523G has a second thickness Y2. Next, the first photoresist 515 is removed.

Figure 6D:
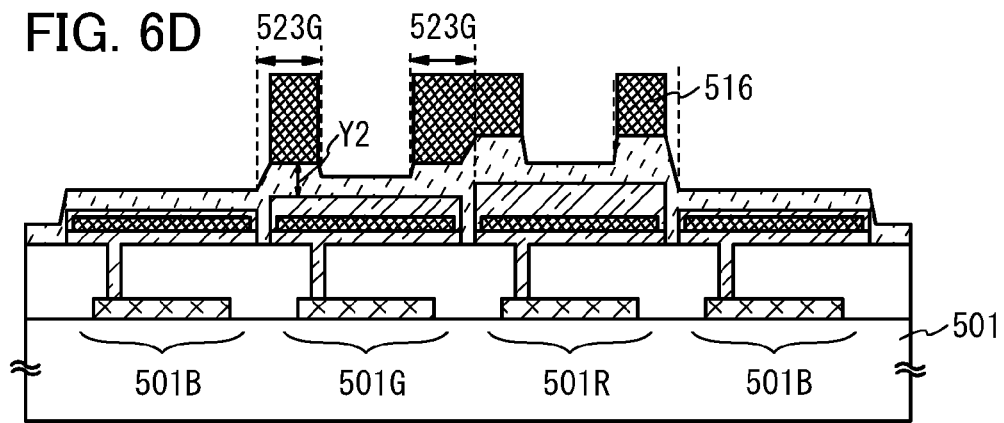

Then, as illustrated in FIG. 6D, a second photoresist 516 is patterned in the non-light-emitting regions 523G and 523R of the pixel portion (green) 501G exhibiting green light emission and the pixel portion (red) 501R exhibiting red light emission so that the partition 514 in the non-light-emitting region 523G of the pixel portion (green) 501G exhibiting green light emission remains to have the second thickness Y2. The partition 514 is etched using the second photoresist 516 as a mask. In this manner, the partition 514 in the non-light-emitting region 523G of the pixel portion (green) 501G exhibiting green light emission remains to have the second thickness Y2 while the partition 514 in the non-light-emitting region of the pixel portion (blue) 501B exhibiting blue light emission has a third thickness. Next, the second photoresist 516 is removed.

Figure 7A:
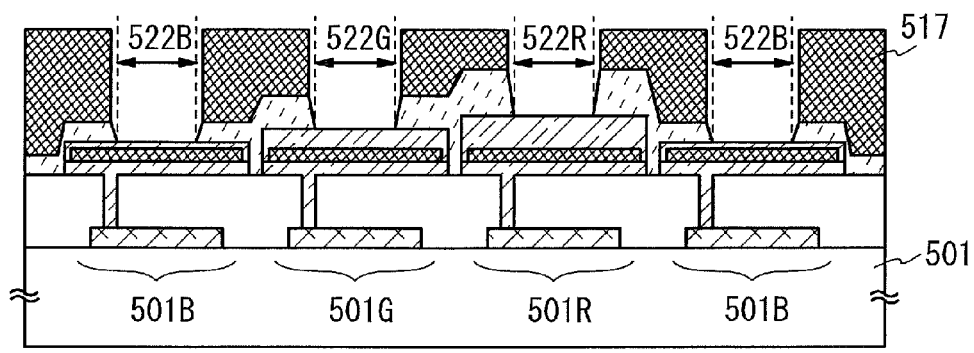
FIGS. 7A and 7B illustrate a method for manufacturing a display device of one embodiment of the present invention.

Then, as illustrated in FIG. 7A, a third photoresist 517 is patterned in the non-light-emitting regions 523G and 523R of the pixel portions 501B, 501G, and 501R, and the partition 514 is etched using the third photoresist as a mask. In this manner, the partition 514 is removed in the light-emitting regions 522B, 522G, and 522R of the pixel portions 501B, 501G, and 501R. Next, the third photoresist 517 is removed.

The above etching is performed such that in each of the pixel portions 501B, 501G, and 501R, an edge of the partition 514 overlaps with an edge of the anode 500 in the non-light-emitting region.

By the etching step illustrated in FIG. 6D, the optical length of the partition 514 (the thickness of the partition 514× the refractive index of the partition 514) in the non-light-emitting region of the pixel portion (blue) 501B is adjusted to be a multiple of (be N/2 times (N is a natural number)) a ½ wavelength of a blue emission wavelength. Further, by the etching step illustrated in FIG. 6C, the optical length of the partition 514 (the thickness Y2×the refractive index of the partition 514) in the non-light-emitting region 523G of the pixel portion (green) 501G is adjusted to be a multiple of (be N/2 times (N is a natural number)) a ½ wavelength of a green emission wavelength. By the formation step of the partition 514 illustrated in FIG. 6C, the optical length of the partition 514 (the thickness Y1×the refractive index of the partition 514) in the non-light-emitting region 523R of the pixel portion (red) 501R is adjusted to be a multiple of (be N/2 times (N is a natural number)) a ½ wavelength of a red emission wavelength.

Figure 7B:
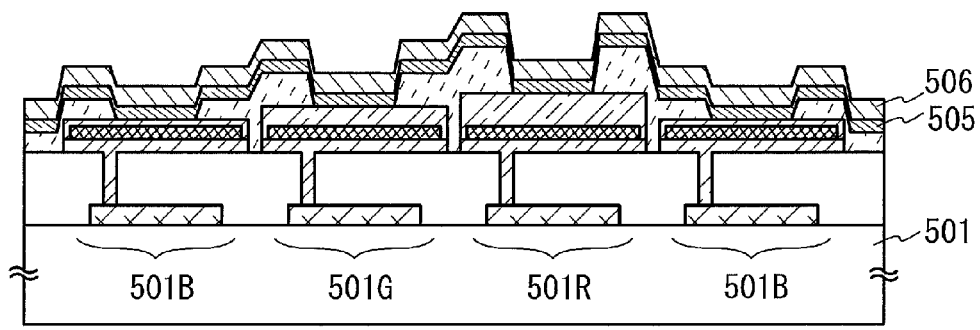

Then, as illustrated in FIG. 7B, the EL layer 505 and the semi-transmissive electrode 506 are sequentially formed over the anodes 500 and the partition 514. Here, the EL layer 505 may have a stacked-layer structure and preferably has a structure that enables white light to be emitted by utilizing a microcavity structure.

Note that when the first substrate obtained by the step illustrated in FIG. 7B and a second substrate provided with color filters and a black matrix are fitted with each other to be sealed, a display device with the structure described in Embodiment 2 can be manufactured.

The structure described in this embodiment can be used in appropriate combination with any of the structures described in the other embodiments.

Embodiment 7

In this embodiment, an example of a method for manufacturing a display device of one embodiment of the present invention will be described. Specifically, a method for manufacturing the display device in Embodiment 3 will be described with reference to FIGS. 8A to 8D and FIG. 9.

Figure 8A:
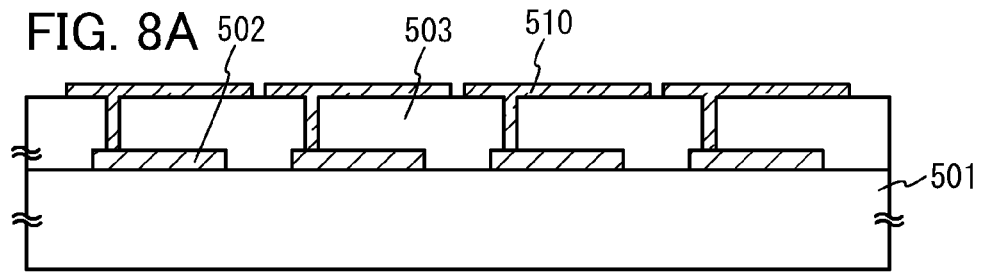
FIGS. 8A to 8D illustrate a method for manufacturing a display device of one embodiment of the present invention.

As illustrated in FIG. 8A, the thin film transistors (TFT) 502, the planarization layer 503, and the wirings 510 are formed over the first substrate 501 by a known method. For example, after the formation of the planarization layer 503, a transparent conductive film made of ITO ($In_2O_3$ doped with $SnO_2$) is formed by a known sputtering method and patterned into a desired shape, whereby the wirings 510 electrically connected to the TFTs 502 can be formed.

Figure 8B:
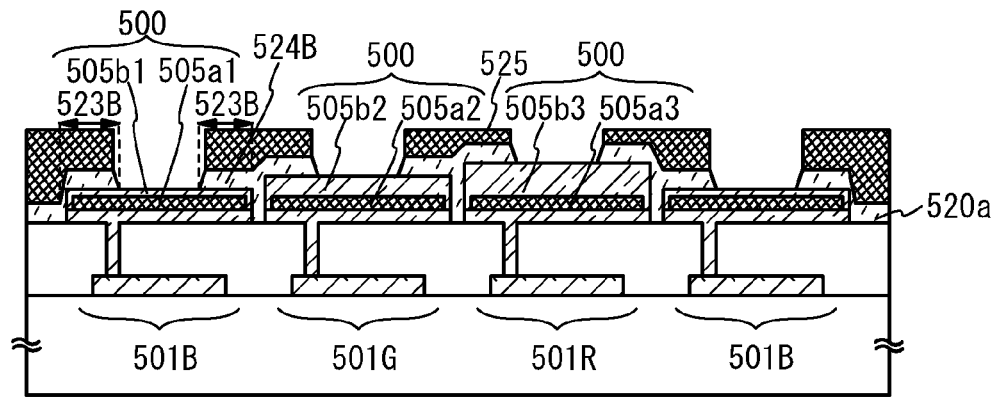

Then, as illustrated in FIG. 8B, the anodes 500 electrically connected to the wirings 510 are formed. The anodes 500 are a stack including the first reflective electrode 505a1 and the first transparent electrode 505b1, a stack including the second reflective electrode 505a2 and the second transparent electrode 505b2, and a stack including the third reflective electrode 505a3 and the third transparent electrode 505b3. The first, second, and third reflective electrodes 505a1, 505a2, and 505a3 are preferably formed using a high reflectance material; for example, silver, a silver alloy, or the like is used. To improve efficiency and color purity of an emission color in each of the pixel portions 501B, 501G, and 501R, the first, second, and third transparent electrodes 505b1, 505b2, and 505b3 are each formed to a thickness suitable for the emission color. For example, the first transparent electrode 505b1 in the pixel portion (blue) 501B exhibiting blue light emission can be 5-nm-thick ITO, the second transparent electrode 505b2 in the pixel portion (green) 501G exhibiting green light emission can be 45-nm-thick ITO, and the third transparent electrode 505b3 in the pixel portion (red) 501R exhibiting red light emission can be 85-nm-thick ITO. Note that the first, second, and third transparent electrodes 505b1, 505b2, and 505b3 may each be a stack including different kinds of transparent conductive films instead of a single film.

Then, a first insulating layer 520a of a partition is formed using an inorganic film to cover end portions of the anodes 500.

At the time of the formation of the first insulating layer 520a, a first photoresist 525 that is commercially available is formed into a predetermined pattern by a known method, and the first insulating layer 520a is patterned by etching. The patterning is performed in the pixel portions 501B, 501G, and 501R such that an edge of the first insulating layer 520a overlaps with an edge of the first reflective electrode 505a1 in the non-light-emitting region 523B. Accordingly, a partition 524B including the first insulating layer 520a is formed in the non-light-emitting region 523B of the pixel portion (blue) 501B exhibiting blue light emission. Note that the optical length of the first insulating layer 520a is adjusted to be a multiple of (be N/2 times (N is a natural number)) a ½ wavelength of a blue emission wavelength. For example, a film made of $SiO_2$ with a refractive index of 1.5 is formed to a thickness of 153 nm. Next, the first photoresist 525 is removed.

Figure 8C:
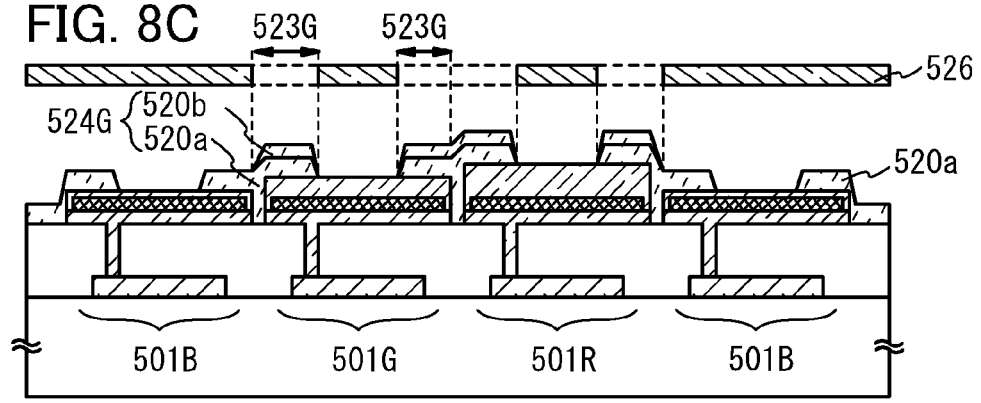

Then, as illustrated in FIG. 8C, a second insulating layer 520b is deposited by evaporation over the first insulating layer 520a in the pixel portion (green) 501G exhibiting green light emission and the pixel portion (red) 501R exhibiting red light emission with the use of a high definition evaporation mask 526. Accordingly, a partition 524G with a stacked-layer structure including the first insulating layer 520a and the second insulating layer 520b is formed in the non-light-emitting region 523G of the pixel portion (green) 501G exhibiting green light emission. Note that the sum of the optical length of the second insulating layer 520b and that of the first insulating layer 520a is adjusted to be a multiple of (be N/2 times (N is a natural number)) a ½ wavelength of a green emission wavelength. For example, when tris(8-quinolinolato)aluminum (III) (abbreviation: Alq), which is a metal complex whose refractive index is 1.7, is used for the second insulating layer 520b, the second insulating layer 520b is formed to a thickness of 18 nm.

Figure 8D:
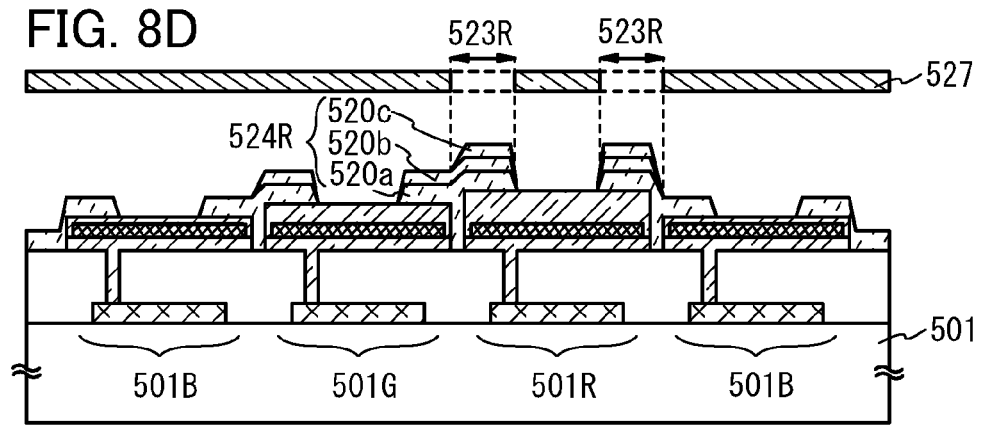

Then, as illustrated in FIG. 8D, a third insulating layer 520c is deposited by evaporation over the second insulating layer 520b in the pixel portion (red) 501R exhibiting red light emission with the use of a high definition evaporation mask 527. Accordingly, a partition 524R with a stacked-layer structure including the first insulating layer 520a, the second insulating layer 520b, and the third insulating layer 520c is formed in the non-light-emitting region 523R of the pixel portion (red) 501R exhibiting red light emission. Note that the sum of the optical length of the third insulating layer 520c, that of the second insulating layer 520b, and that of the first insulating layer 520a is adjusted to be a multiple of (be N/2 times (N is a natural number)) a ½ wavelength of a red emission wavelength. For example, when Alq (abbreviation) whose refractive index is 1.7 is used for the third insulating layer 520c, the third insulating layer 520c is formed to a thickness of 32 nm.

Note that the second insulating layer 520b and the third insulating layer 520c may be formed using the same material as the first insulating layer 520a.

The patterning is performed such that an edge of the first insulating layer 520a overlaps with an edge of the anode 500 in each of the non-light-emitting regions 523B, 523G, and 523R of the pixel portions 501B, 501G, and 501R.

Figure 9:
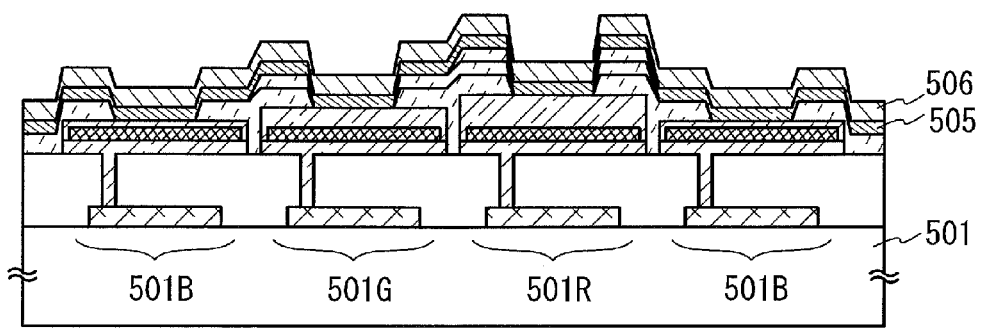
FIG. 9 illustrates a method for manufacturing a display device of one embodiment of the present invention.

Then, as illustrated in FIG. 9, the EL layer 505 and the semi-transmissive electrode 506 are sequentially formed over the anodes 500 and the partitions 520a, 520b, and 520c. Here, the EL layer 505 may have a stacked-layer structure and preferably has a structure that enables white light to be emitted by utilizing a microcavity structure.

Note that when the first substrate obtained by the step illustrated in FIG. 9 and a second substrate provided with color filters and a black matrix are fitted with each other to be sealed, a display device with the structure described in Embodiment 3 can be manufactured.

The structure described in this embodiment can be used in appropriate combination with any of the structures described in the other embodiments.

Embodiment 8

In this embodiment, an example of a method for manufacturing a display device of one embodiment of the present invention will be described. Specifically, a method for manufacturing the display device in Embodiment 4 will be described with reference to FIGS. 10A to 10D.

Figure 10A:
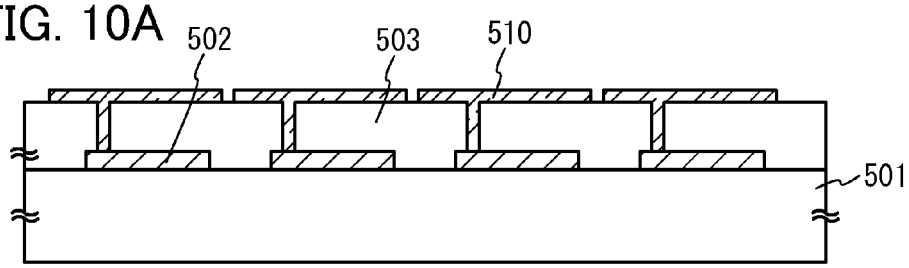
FIGS. 10A to 10D illustrate a method for manufacturing a display device of one embodiment of the present invention.

As illustrated in FIG. 10A, the thin film transistor (TFT) 502, the planarization layer 503, and the wiring 510 are formed over the first substrate 501 by a known method. For example, after the formation of the planarization layer 503, a transparent conductive film made of ITO ($In_2O_3$ doped with $SnO_2$) is formed by a known sputtering method and patterned into a desired shape, whereby the wiring 510 electrically connected to the TFT 502 can be formed.

Figure 10B:
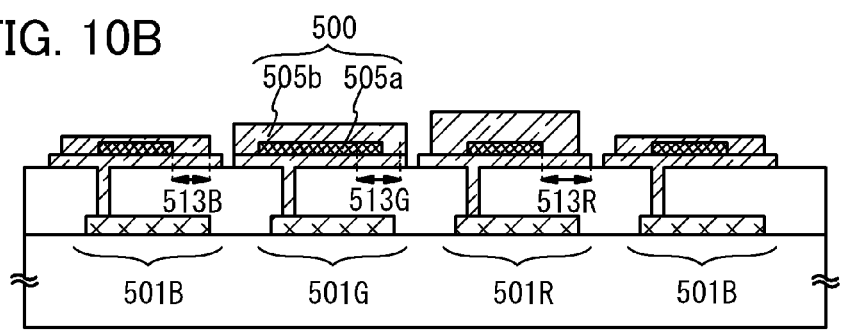

Then, as illustrated in FIG. 10B, the anode 500 electrically connected to the wiring 510 is formed. The anode 500 is a stack including the reflective electrode 505a and the transparent electrode 505b. The reflective electrode 505a is preferably formed using a high reflectance material; for example, silver, a silver alloy, or the like is used. To improve efficiency and color purity of an emission color in each of the pixel portions 501B, 501G, and 501R, the transparent electrode 505b is formed to a thickness suitable for the emission color. For example, the transparent electrode 505b in the pixel portion (blue) 501B exhibiting blue light emission can be 5-nm-thick ITO, the transparent electrode 505b in the pixel portion (green) 501G exhibiting green light emission can be 45-nm-thick ITO, and the transparent electrode 505b in the pixel portion (red) 501R exhibiting red light emission can be 85-nm-thick ITO. Note that the transparent electrode 505b may be a stack including different kinds of transparent conductive films instead of a single film.

Figure 10C:
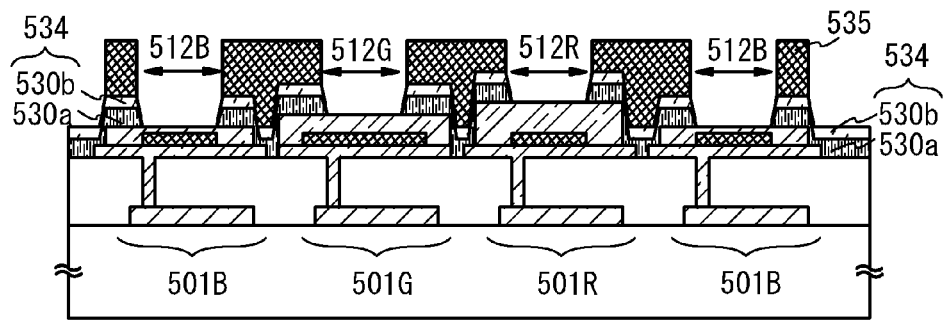

Then, as illustrated in FIG. 10C, a stacked-layer film including a first insulating layer 530a and a second insulating layer 530b of a partition 534 is formed to cover the end portion of the anode 500.

At the time of the formation of the partition 534, the second insulating layer 530b is formed over the first insulating layer 530a, a first photoresist 535 that is commercially available is formed into a predetermined pattern by a known method, and the first insulating layer 530a and the second insulating layer 530b are patterned by etching. Note that the patterning is preferably performed such that an edge of the partition 534 and an edge of the reflective electrode 505a are placed at the same position in each of the pixel portion (blue) 501B exhibiting blue light emission and the pixel portion (red) 501R exhibiting red light emission. Although the edge of the partition 534 does not necessarily overlap with that of the reflective electrode 505a in the pixel portion (green) 501G exhibiting green light emission, the patterning in this embodiment is performed such that they overlap with each other.

Note that a refractive index difference at the interface between the first insulating layer 530a and the second insulating layer 530b is made large. Specifically, the refractive index difference is set to 0.1 or more.

In other words, the optical length of the second insulating layer 530b is adjusted in accordance with the refractive index relationship between the first insulating layer 530a and the second insulating layer 530b. When the refractive index of the first insulating layer 530a is smaller than that of the second insulating layer 530b, the optical length of the second insulating layer 530b is adjusted to the sum of the optical length of the transparent electrode 505b in the pixel portion (green) 501G and a green wavelength multiplied by (2N−1)/4 (N is a natural number). When the refractive index of the first insulating layer 530a is larger than that of the second insulating layer 530b, the optical length of the second insulating layer 530b is adjusted to the optical length of the transparent electrode 505b in the pixel portion (green) 501G or the sum of the optical length of the transparent electrode 505b in the pixel portion (green) 501G and a multiple of a ½ wavelength of a green emission wavelength (a ½ wavelength of a green wavelength multiplied by N/2 (N is a natural number)).

For example, when $TiO_2$ whose refractive index is 2.5 is used for the first insulating layer 530a and $SiO_2$ whose refractive index is 1.5 is used for the second insulating layer 530b, the first insulating layer 530a is formed to a desired thickness and the second insulating layer 530b is formed to a thickness of 173 nm.

Figure 10D:
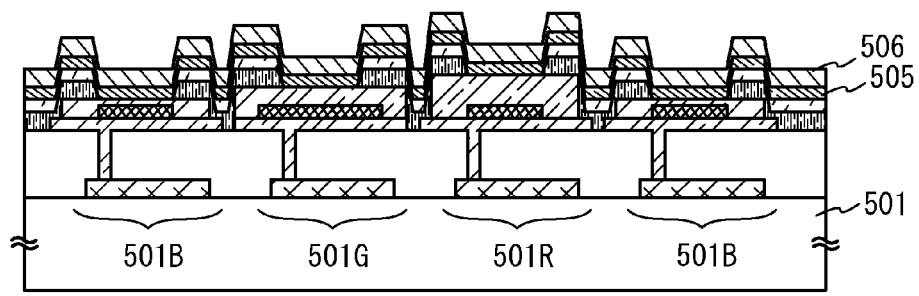

Then, as illustrated in FIG. 10D, the EL layer 505 and the semi-transmissive electrode 506 are sequentially formed over the anode 500 and the partition 534. Here, the EL layer 505 may have a stacked-layer structure and preferably has a structure that enables white light to be emitted by utilizing a microcavity structure.

Note that when the first substrate obtained by the step illustrated in FIG. 10D and a second substrate provided with color filters and a black matrix are fitted with each other to be sealed, a display device with the structure described in Embodiment 4 can be manufactured.

The structure described in this embodiment can be used in appropriate combination with any of the structures described in the other embodiments.

Embodiment 9

In this embodiment, a structure applicable to the EL layer of the above-described light-emitting element will be described as one embodiment of the present invention. Note that a light-emitting element in this embodiment in which an EL layer (1103 in FIG. 11) is provided between a pair of electrodes is also called a tandem light-emitting element.

The EL layer 1103 in this embodiment has a structure in which a plurality of EL layers are stacked with a charge-generation layer provided therebetween. In the tandem light-emitting element illustrated in FIG. 11, two EL layers (a first EL layer 1102(1) and a second EL layer 1102(2)) are stacked with a charge-generation layer 1105 provided therebetween.

Note that the number of stacked EL layers is not limited to two and three EL layers may be stacked with charge-generation layers provided therebetween.

Figure 11:
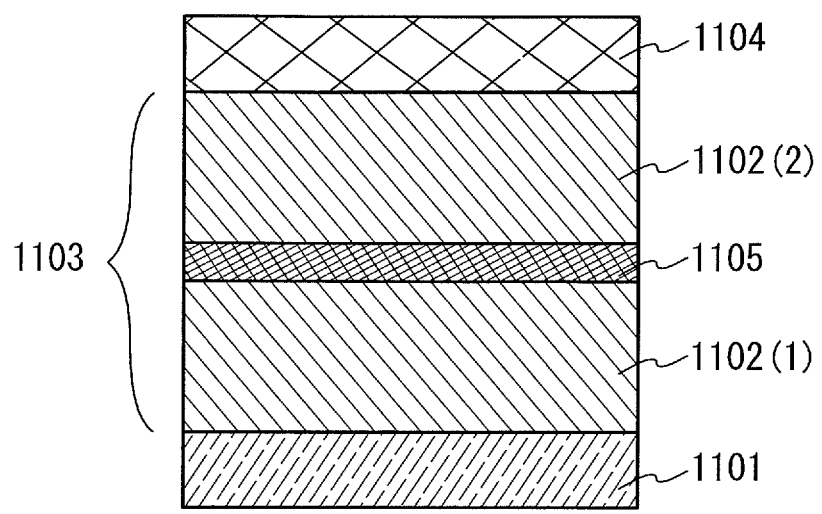
FIG. 11 illustrates an EL layer of one embodiment of the present invention.
Figure 12:
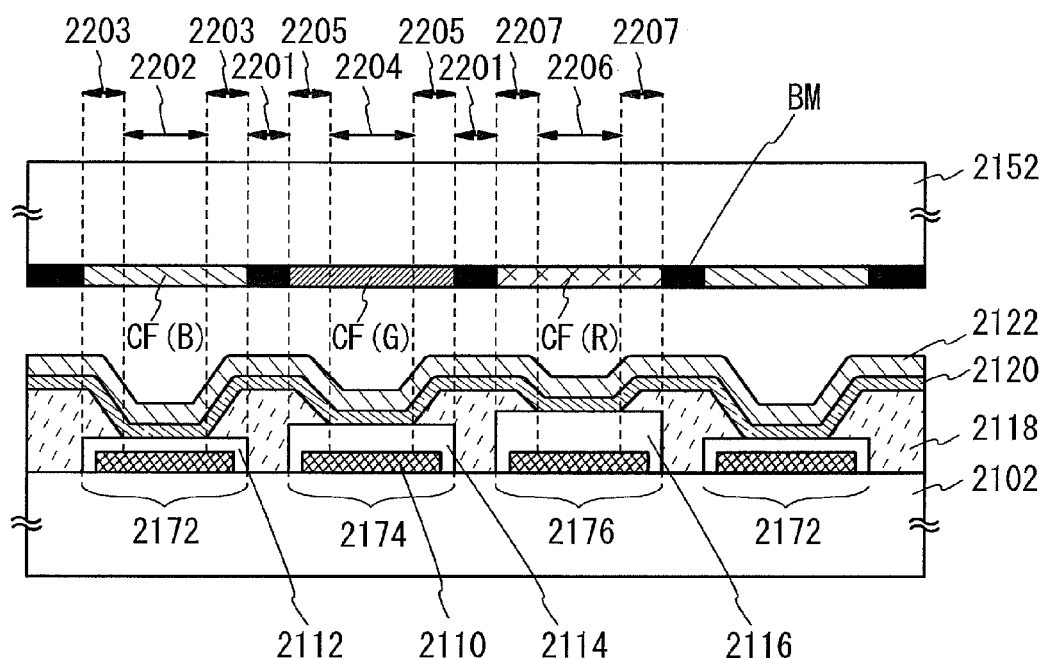
FIG. 12 illustrates a conventional display device.
Figure 13:
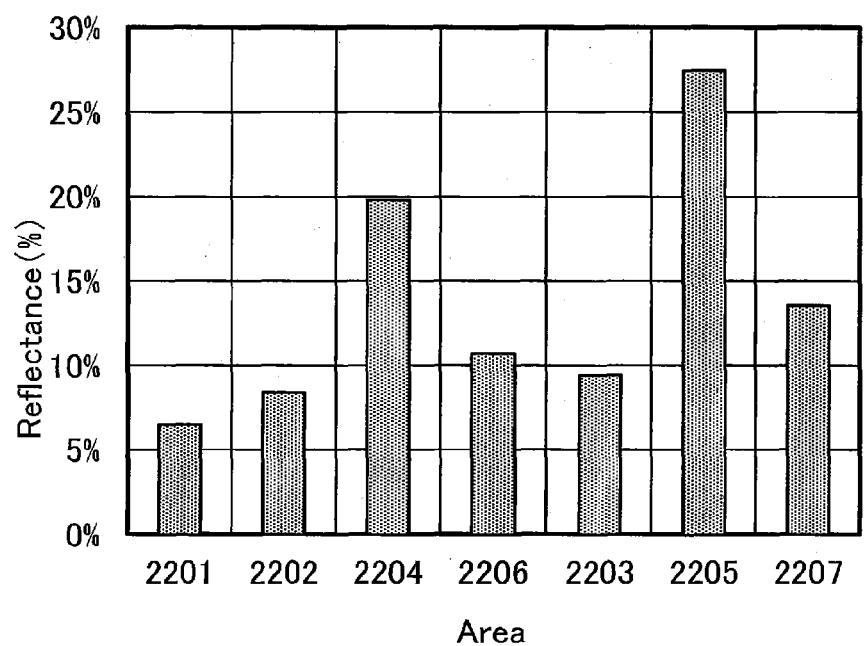
FIG. 13 shows measurement results of reflectances in a conventional display device.

The charge-generation layer 1105 between the two EL layers (the first EL layer 1102(1) and the second EL layer 1102(2)) in FIG. 11 has a function of injecting electrons into one of the EL layers and injecting holes into the other of the EL layers when a voltage is applied between the first electrode 1101 and the second electrode 1104. For example, when a voltage is applied to the first electrode 1101 such that the potential of the first electrode 1101 is higher than that of the second electrode 1104, the charge-generation layer 1105 injects electrons into the first EL layer 1102(1) and injects holes into the second EL layer 1102(2).

Note that in terms of light extraction efficiency, the charge-generation layer 1105 preferably has a light-transmitting property with respect to visible light (specifically, the charge-generation layer 1105 has a visible light transmittance of 40% or more). Further, the charge-generation layer 1105 functions even if it has lower conductivity than the first electrode 1101 or the second electrode 1104.

The charge-generation layer 1105 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances mentioned here are mainly ones that have a hole mobility of $10^{-6}$ cm$^2$/Vs or higher. However, substances other than the above substances may be used as long as they are organic compounds having a hole-transport property higher than an electron-transport property.

Further, as the electron acceptor, 7,7,8,8-tetracyano-2,3,5,6-tetrafluoroquinodimethane (abbreviation: $F_4$-TCNQ), chloranil, or the like can be used. Alternatively, a transition metal oxide can be used. Further alternatively, an oxide of metals that belong to Group 4 to Group 8 of the periodic table can be used. Specifically, vanadium oxide, niobium oxide, tantalum oxide, chromium oxide, molybdenum oxide, tungsten oxide, manganese oxide, and rhenium oxide are preferable because their electron-accepting property is high. Among these, molybdenum oxide is especially preferable because it is stable in the air, has a low hygroscopic property, and is easily handled.

On the other hand, in the case of the structure in which an electron donor is added to an organic compound having a high electron-transport property, as the organic compound having a high electron-transport property for example, a metal complex having a quinoline skeleton or a benzoquinoline skeleton, such as Alq, Almq$_3$, BeBq$_2$, or BAlq, or the like can be used. Alternatively, it is possible to use a metal complex having an oxazole-based ligand or a thiazole-based ligand, such as Zn(BOX)$_2$ or Zn(BTZ)$_2$, or the like. Further alternatively, instead of a metal complex, it is possible to use PBD, OXD-7, TAZ, BPhen, BCP, or the like. The substances mentioned here are mainly ones that have an electron mobility of $10^{-6}$ cm$^2$/Vs or higher. Note that substances other than the above substances may be used as long as they are organic compounds having an electron-transport property higher than a hole-transport property.

As the electron donor, it is possible to use an alkali metal, an alkaline earth metal, a rare earth metal, a metal belonging to Group 13 of the periodic table, or an oxide or carbonate thereof. Specifically, it is preferable to use lithium (Li), cesium (Cs), magnesium (Mg), calcium (Ca), ytterbium (Yb), indium (In), lithium oxide, cesium carbonate, or the like. Alternatively, an organic compound such as tetrathianaphthacene may be used as the electron donor.

Note that forming the charge-generation layer 1105 by using any of the above materials can inhibit an increase in drive voltage caused by the stack of the EL layers.

In each of the EL layers (e.g., the first EL layer 1102(1) and the second EL layer 1102(2)), a plurality of functional layers (e.g., a hole-injection layer, a hole-transport layer, a light-emitting layer, an electron-transport layer, and an electron-injection layer) may be stacked. Such functional layers can be formed using a known material by a known method.

When a plurality of EL layers are provided between a pair of electrodes, as in the light-emitting element in this embodiment, by providing a charge-generation layer between the EL layers, a light-emitting element can emit light in a high luminance region while the current density is kept low. Since the current density can be kept low, the element can have a long lifetime. Further, in application to lighting devices, a voltage drop due to resistance of an electrode material can be reduced and accordingly uniform light emission in a large area is possible. In addition, a low-power-consumption light-emitting device which can be driven at low voltage can be achieved.

By making the EL layers emit light of different colors from each other, the light-emitting element can provide light emission of a desired color as a whole. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. In other words, white light emission can be obtained by mixture of light emitted from substances whose emission colors are complementary colors.

Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

This application is based on Japanese Patent Application serial no. 2013-058654 filed with Japan Patent Office on Mar. 21, 2013, the entire contents of which are hereby incorporated by reference.

What is claimed is:

1. A display device comprising:
   a reflective electrode;
   a transparent electrode over the reflective electrode;
   a partition surrounding the transparent electrode and the reflective electrode and overlapping the transparent electrode;
   a layer containing a light-emitting organic compound over the partition and the transparent electrode;
   a semi-transmissive electrode over the layer containing the light-emitting organic compound; and
   a coloring layer over the semi-transmissive electrode,
   wherein a light-emitting region is provided in a region which overlaps the transparent electrode, the layer containing the light-emitting organic compound, the semi-transmissive electrode, and the coloring layer,
   wherein a non-light-emitting region is provided in a region which overlaps the transparent electrode, the partition, the layer containing the light-emitting organic compound, and the coloring layer,
   wherein the non-light-emitting region surrounds the light-emitting region,
   wherein a sum of an optical length of the transparent electrode and an optical length of the layer containing the light-emitting organic compound is adjusted to fulfill a condition of a microcavity intensifying light of a color of the coloring layer, and
   wherein an optical length of the partition in the non-light-emitting region is adjusted to weaken external light incident through the coloring layer.

2. The display device according to claim 1, wherein the optical length of the partition in the non-light-emitting region is adjusted to a multiple of a ½ wavelength of a wavelength of the color of the coloring layer.

3. The display device according to claim 2, wherein the color of the coloring layer is green.

4. An electronic device comprising the display device according to claim 1.

5. A display device comprising:
   a reflective electrode;
   a transparent electrode over the reflective electrode;
   a partition surrounding the transparent electrode and the reflective electrode;
   a layer containing a light-emitting organic compound over the transparent electrode;
   a semi-transmissive electrode over the layer containing the light-emitting organic compound; and
   a coloring layer over the semi-transmissive electrode and the partition,
   wherein the partition is a stacked-layer film including a first insulating layer and a second insulating layer with different refractive indices,
   wherein a light-emitting region is provided in a region which overlaps the transparent electrode, the layer containing the light-emitting organic compound, the semi-transmissive electrode, and the coloring layer,
   wherein a non-light-emitting region is provided in a region which overlaps the transparent electrode, the partition, the layer containing the light-emitting organic compound, and the coloring layer,
   wherein the non-light-emitting region surrounds the light-emitting region,
   wherein a sum of an optical length of the transparent electrode and an optical length of the layer containing the light-emitting organic compound is adjusted to fulfill a condition of a microcavity intensifying light of a color of the coloring layer, and
   wherein an optical length of the second insulating layer in the non-light-emitting region is adjusted to weaken external light incident through the coloring layer.

6. The display device according to claim 5,
   wherein when the refractive index of the first insulating layer is smaller than the refractive index of the second insulating layer, the optical length of the second insulating layer is adjusted to a sum of the optical length of the transparent electrode and a wavelength of the color of the coloring layer multiplied by $(2N-1)/4$ (N is a natural number), and wherein when the refractive index of the first insulating layer is larger than the refractive index of the second insulating layer, the optical length of the second insulating layer is adjusted to a sum of the optical length of the transparent electrode and a multiple of a ½ wavelength of the wavelength of the color of the coloring layer.

7. The display device according to claim 6, wherein a difference between the refractive index of the first insulating layer and the refractive index of the second insulating layer is 0.1 or more.

8. The display device according to claim 5, wherein the color of the coloring layer is green.

9. An electronic device comprising the display device according to claim 5.

10. A display device comprising:
a first reflective electrode and a second reflective electrode;
a first transparent electrode over the first reflective electrode;
a second transparent electrode over the second reflective electrode;
a first partition surrounding the first reflective electrode and the first transparent electrode over the first transparent electrode;
a second partition surrounding the second reflective electrode and the second transparent electrode over the second transparent electrode;
a layer containing a light-emitting organic compound over the first partition, the second partition, the first transparent electrode, and the second transparent electrode;
a semi-transmissive electrode over the layer containing the light-emitting organic compound; and
a first coloring layer and a second coloring layer over the semi-transmissive electrode,
wherein a first light-emitting region is provided in a region which overlaps the first transparent electrode, the layer containing the light-emitting organic compound, the semi-transmissive electrode, and the first coloring layer,
wherein a first non-light-emitting region is provided in a region which overlaps the first transparent electrode, the first partition, the layer containing the light-emitting organic compound, and the first coloring layer,
wherein the first non-light-emitting region surrounds the first light-emitting region,
wherein a sum of an optical length of the first transparent electrode and an optical length of the layer containing the light-emitting organic compound is adjusted to fulfill a condition of a microcavity intensifying light of a color of the first coloring layer,
wherein an optical length of the first partition is adjusted to weaken external light incident through the first coloring layer,
wherein a second light-emitting region is provided in a region which overlaps the second transparent electrode, the layer containing the light-emitting organic compound, the semi-transmissive electrode, and the second coloring layer,
wherein a second non-light-emitting region is provided in a region which overlaps the second transparent electrode, the second partition, the layer containing the light-emitting organic compound, and the second coloring layer,
wherein the second non-light-emitting region surrounds the second light-emitting region,
wherein a sum of an optical length of the second transparent electrode and the optical length of the layer containing the light-emitting organic compound is adjusted to fulfill a condition of a microcavity intensifying light of a color of the second coloring layer, and
wherein an optical length of the second partition is adjusted to weaken external light incident through the second coloring layer.

11. The display device according to claim 10,
wherein the optical length of the first partition is adjusted to a multiple of a ½ wavelength of a wavelength of the color of the first coloring layer, and
wherein the optical length of the second partition is adjusted to a multiple of a ½ wavelength of a wavelength of the color of the second coloring layer.

12. The display device according to claim 10,
wherein the first partition comprises a first insulating layer,
wherein an optical length of the first insulating layer is adjusted to the multiple of the ½ wavelength of the wavelength of the color of the first coloring layer,
wherein the second partition comprises a stacked-layer film including the first insulating layer and a second insulating layer, and
wherein a sum of an optical length of the second insulating layer and the optical length of the first insulating layer is adjusted to the multiple of the ½ wavelength of the wavelength of the color of the second coloring layer.

13. The display device according to claim 10, further comprising a light-blocking portion over the semi-transmissive electrode and between the first coloring layer and the second coloring layer.

14. An electronic device comprising the display device according to claim 10.

15. A manufacturing method of a display device, comprising the steps of:
forming a transparent electrode over a reflective electrode;
forming a partition surrounding the transparent electrode and the reflective electrode and overlapping the transparent electrode;
forming a layer containing a light-emitting organic compound over the partition and the transparent electrode;
forming a semi-transmissive electrode over the layer containing the light-emitting organic compound; and
placing a coloring layer over the semi-transmissive electrode,
wherein a light-emitting region is provided in a region which overlaps the transparent electrode, the layer containing the light-emitting organic compound, the semi-transmissive electrode, and the coloring layer,
wherein a non-light-emitting region is provided in a region which overlaps the transparent electrode, the partition, the layer containing the light-emitting organic compound, and the coloring layer,
wherein a sum of an optical length of the transparent electrode and an optical length of the layer containing the light-emitting organic compound is adjusted to fulfill a condition of a microcavity intensifying light of a color of the coloring layer, and
wherein an optical length of the partition in the non-light-emitting region is adjusted to weaken external light incident through the coloring layer.

16. The manufacturing method of the display device according to claim 15, wherein the optical length of the partition in the non-light-emitting region is adjusted to a multiple of a ½ wavelength of a wavelength of the color of the coloring layer.

17. A manufacturing method of a display device, comprising the steps of:
forming a transparent electrode over a reflective electrode;
forming a partition including a first insulating layer and a second insulating layer with different refractive indices, surrounding the transparent electrode and the reflective electrode, and overlapping the transparent electrode;
forming a layer containing a light-emitting organic compound over the partition and the transparent electrode;
forming a semi-transmissive electrode over the layer containing the light-emitting organic compound; and
placing a coloring layer over the semi-transmissive electrode,
wherein a light-emitting region is provided in a region which overlaps the transparent electrode, the layer containing the light-emitting organic compound, the semi-transmissive electrode, and the coloring layer,
wherein a non-light-emitting region is provided in a region which overlaps the transparent electrode, the partition, the layer containing the light-emitting organic compound, and the coloring layer,
wherein the non-light-emitting region surrounds the light-emitting region,
wherein a sum of an optical length of the transparent electrode and an optical length of the layer containing the light-emitting organic compound is adjusted to fulfill a condition of a microcavity intensifying light of a color of the coloring layer, and
wherein an optical length of the second insulating layer in the non-light-emitting region is adjusted to weaken external light incident through the coloring layer.

18. The manufacturing method of the display device according to claim 17,
wherein when the refractive index of the first insulating layer is smaller than the refractive index of the second insulating layer, the optical length of the second insulating layer is adjusted to a sum of the optical length of the transparent electrode and a wavelength of the color of the coloring layer multiplied by (2N−1)/4 (N is a natural number), and
wherein when the refractive index of the first insulating layer is larger than the refractive index of the second insulating layer, the optical length of the second insulating layer is adjusted to a sum of the optical length of the transparent electrode and a multiple of a ½ wavelength of the wavelength of the color of the coloring layer.

19. A manufacturing method of a display device, comprising the steps of:
forming a first reflective electrode in a first light-emitting region and a first non-light-emitting region surrounding the first light-emitting region, and forming a second reflective electrode in a second light-emitting region and a second non-light-emitting region surrounding the second light-emitting region;
forming a first transparent electrode over the first reflective electrode, and forming a second transparent electrode over the second reflective electrode;
forming a partition with a first thickness over the first transparent electrode and the second transparent electrode;
forming a first photoresist over the partition in the first non-light-emitting region;
etching the partition with the first photoresist as a mask to keep the first thickness of the partition in the first non-light-emitting region and to make the partition in the second non-light-emitting region have a second thickness smaller than the first thickness;
removing the first photoresist;
forming a second photoresist over the partition in each of the first non-light-emitting region and the second non-light-emitting region;
etching the partition with the second photoresist as a mask to remove the partition in each of the first light-emitting region and the second light-emitting region;
removing the second photoresist;
forming a layer containing a light-emitting organic compound over the partition, the first transparent electrode, and the second transparent electrode;
forming a semi-transmissive electrode over the layer containing the light-emitting organic compound; and
placing a first coloring layer and a second coloring layer over the semi-transmissive electrode,
wherein the first light-emitting region is a region which overlaps the first transparent electrode, the layer containing the light-emitting organic compound, the semi-transmissive electrode, and the first coloring layer,
wherein the first non-light-emitting region is a region which overlaps the first transparent electrode, the partition, the layer containing the light-emitting organic compound, and the first coloring layer,
wherein a sum of an optical length of the first transparent electrode and an optical length of the layer containing the light-emitting organic compound in the first light-emitting region is adjusted to fulfill a condition of a microcavity intensifying light of a color of the first coloring layer,
wherein an optical length of the partition in the first non-light-emitting region is adjusted to weaken external light incident through the first coloring layer,
wherein the second light-emitting region is a region which overlaps the second transparent electrode, the layer containing the light-emitting organic compound, the semi-transmissive electrode, and the second coloring layer,
wherein the second non-light-emitting region is a region which overlaps the second transparent electrode, the partition, the layer containing the light-emitting organic compound, and the second coloring layer,
wherein a sum of a thickness of the second transparent electrode and a thickness of the layer containing the light-emitting organic compound in the second light-emitting region is adjusted to fulfill a condition of a microcavity intensifying light of a color of the second coloring layer, and
wherein an optical length of the partition in the second non-light-emitting region is adjusted to weaken external light incident through the second coloring layer.

20. The manufacturing method of the display device according to claim 19,
wherein the optical length of the partition in the first non-light-emitting region is adjusted to a multiple of a ½ wavelength of a wavelength of the color of the first coloring layer, and
wherein the optical length of the partition in the second non-light-emitting region is adjusted to a multiple of a ½ wavelength of a wavelength of the color of the second coloring layer.

21. A manufacturing method of a display device, comprising the steps of:
forming a first reflective electrode in a first light-emitting region and a first non-light-emitting region surrounding the first light-emitting region, and forming a second reflective electrode in a second light-emitting region and a second non-light-emitting region surrounding the second light-emitting region;

forming a first transparent electrode over the first reflective electrode, and forming a second transparent electrode over the second reflective electrode;

forming a first insulating layer over the first transparent electrode in the first non-light-emitting region and over the second transparent electrode in the second non-light-emitting region;

forming a second insulating layer over the first insulating layer in the second non-light-emitting region;

forming a layer containing a light-emitting organic compound over the first insulating layer in the first non-light-emitting region, the second insulating layer in the second non-light-emitting region, the first transparent electrode in the first light-emitting region, and the second transparent electrode in the second light-emitting region;

forming a semi-transmissive electrode over the layer containing the light-emitting organic compound; and placing a first coloring layer and a second coloring layer over the semi-transmissive electrode, wherein the first insulating layer and the second insulating layer form a partition, wherein the first light-emitting region is a region which overlaps the first transparent electrode, the layer containing the light-emitting organic compound, the semi-transmissive electrode, and the first coloring layer, wherein the first non-light-emitting region is a region which overlaps the first transparent electrode, the partition, the layer containing the light-emitting organic compound, and the first coloring layer, wherein a sum of an optical length of the first transparent electrode and an optical length of the layer containing the light-emitting organic compound in the first light-emitting region is adjusted to fulfill a condition of a microcavity intensifying light of a color of the first coloring layer, wherein an optical length of the partition in the first non-light-emitting region is adjusted to weaken external light incident through the first coloring layer, wherein the second light-emitting region is a region which overlaps the second transparent electrode, the layer containing the light-emitting organic compound, the semi-transmissive electrode, and the second coloring layer, wherein the second non-light-emitting region is a region which overlaps the second transparent electrode, the partition, the layer containing the light-emitting organic compound, and the second coloring layer, wherein a sum of a thickness of the second transparent electrode and a thickness of the layer containing the light-emitting organic compound in the second light-emitting region is adjusted to fulfill a condition of a microcavity intensifying light of a color of the second coloring layer, and wherein an optical length of the partition in the second non-light-emitting region is adjusted to weaken external light incident through the second coloring layer.

22. The manufacturing method of the display device according to claim 21, wherein the optical length of the partition in the first non-light-emitting region is adjusted to a multiple of a ½ wavelength of a wavelength of the color of the first coloring layer, and wherein the optical length of the partition in the second non-light-emitting region is adjusted to a multiple of a ½ wavelength of a wavelength of the color of the second coloring layer.

* * * * *